United States Patent
Ito

(10) Patent No.: US 11,631,834 B2
(45) Date of Patent: Apr. 18, 2023

(54) LIGHT EMITTING APPARATUS, DISPLAY APPARATUS, IMAGE CAPTURING APPARATUS, ELECTRONIC DEVICE, ILLUMINATION APPARATUS, AND MOVING BODY

(71) Applicant: CANON KABUSHIKI KAISHA, Tokyo (JP)

(72) Inventor: Takayuki Ito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 245 days.

(21) Appl. No.: 17/198,664

(22) Filed: Mar. 11, 2021

(65) Prior Publication Data

US 2021/0305538 A1 Sep. 30, 2021

(30) Foreign Application Priority Data

Mar. 27, 2020 (JP) .............................. JP2020-058309

(51) Int. Cl.
*H01L 51/52* (2006.01)
*F21V 3/00* (2015.01)
(Continued)

(52) U.S. Cl.
CPC ............ *H01L 51/5265* (2013.01); *F21V 3/00* (2013.01); *H01L 27/322* (2013.01); *H01L 27/3234* (2013.01); *H01L 27/3244* (2013.01); *H01L 51/5218* (2013.01); *H01L 51/5234* (2013.01); *H01L 51/5275* (2013.01); *H01L 51/56* (2013.01); *H01L 2251/5315* (2013.01)

(58) Field of Classification Search
CPC ............. H01L 51/5265; H01L 51/5218; H01L 51/5234; H01L 51/5275; H01L 51/51; H01L 27/322; H01L 27/3234; H01L 27/3244; H01L 27/3211; H01L 2251/5315; F21V 3/00; B60Q 1/50; B60Q 1/503; F21S 8/00; F21S 43/145; F21W 2103/35; F21Y 2105/00
See application file for complete search history.

(56) References Cited

U.S. PATENT DOCUMENTS

2008/0018239 A1* 1/2008 Matsuda .................. H01J 1/74
445/24
2011/0317429 A1 12/2011 Aiba et al.
(Continued)

FOREIGN PATENT DOCUMENTS

JP 2010-251095 A 11/2010
JP 2017-107887 A 6/2017

*Primary Examiner* — Anne M Hines
*Assistant Examiner* — Jose M Diaz
(74) *Attorney, Agent, or Firm* — Venable LLP

(57) ABSTRACT

A light emitting apparatus includes a first light emitting element for a first color and a second light emitting element for a second color whose wavelength is shorter than the wavelength of the first color. The first light emitting element includes a first reflection layer, a first transparent insulating layer, a first transparent electrode layer, a first light emitting layer, and a first upper electrode layer in this order. The second light emitting element includes a second reflection layer, a second transparent electrode layer, a second light emitting layer, and a second upper electrode layer in this order. The second reflection layer and the second transparent electrode layer are in contact with each other.

12 Claims, 12 Drawing Sheets

(51) Int. Cl.
*H01L 27/32* (2006.01)
*H01L 51/56* (2006.01)

(56) References Cited

U.S. PATENT DOCUMENTS

| | | |
|---|---|---|
| 2014/0361316 A1 | 12/2014 | Nozawa et al. |
| 2018/0083226 A1* | 3/2018 | Ichikawa ............ H01L 27/3244 |
| 2021/0313485 A1* | 10/2021 | Montgomery .......... H01L 33/06 |

* cited by examiner

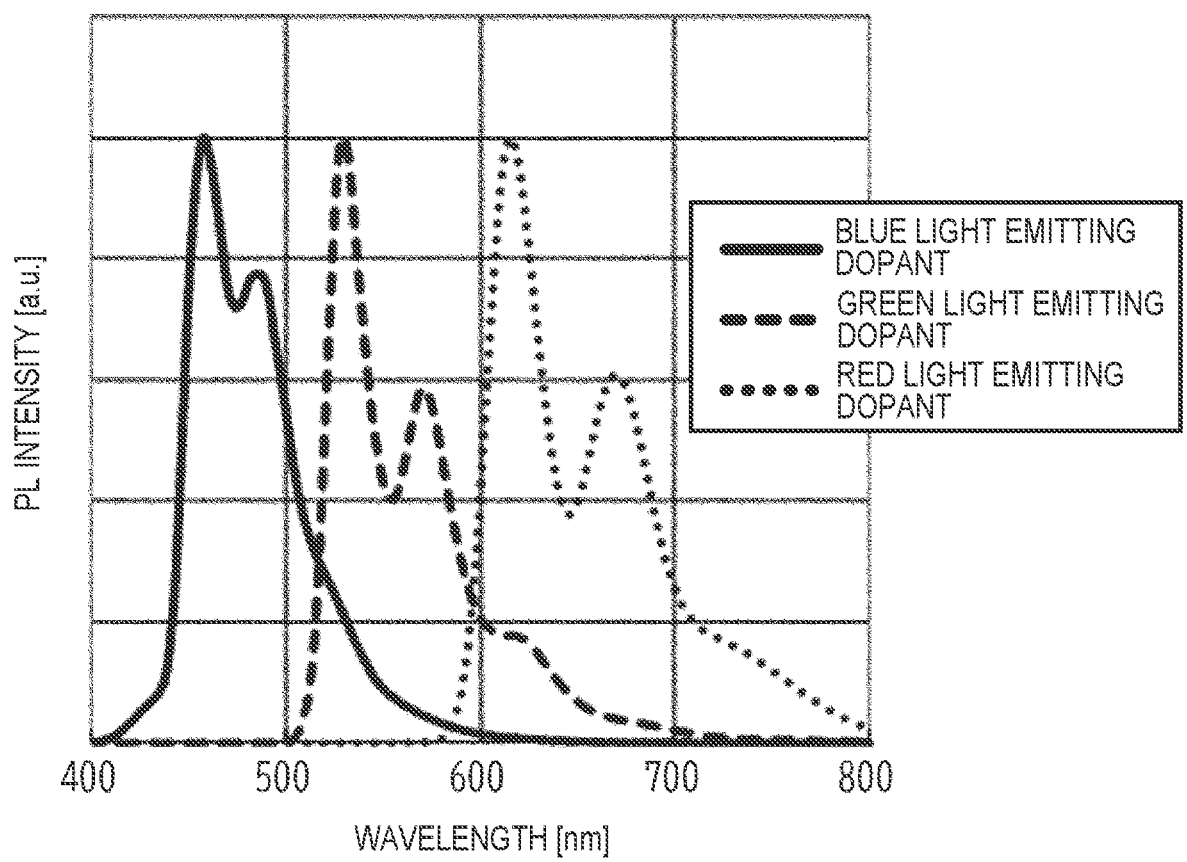

LIGHT EMITTING APPARATUS, DISPLAY APPARATUS, IMAGE CAPTURING APPARATUS, ELECTRONIC DEVICE, ILLUMINATION APPARATUS, AND MOVING BODY

BACKGROUND OF THE INVENTION

Field of the Invention

The present invention relates to a light emitting apparatus, a display apparatus, an image capturing apparatus, an electronic device, an illumination apparatus, and a moving body.

Description of the Related Art

A full color display apparatus that can emit light of three primary colors of red (R), green (G), and blue (B) has been put into practical use. US2014/0361316 discloses that a microresonator structure is used to improve the color purity in a full color display apparatus that includes light emitting elements using organic light emitting materials. A microresonator structure is a structure that increases light of a specific wavelength by causing direct light from a light emitting layer and reflected light from a reflection layer to interfere with each other. In the display apparatus disclosed in US2014/0361316, the color purity is further improved by changing the film thickness of a transparent insulating layer between the light emitting layer and a reflection layer for the color light emitting element of each color.

In an interference structure that causes specific wavelengths such as red, green and blue to resonate, it is known that a light emission luminance largely depends on a viewing angle. This phenomenon becomes pronounced when the distance of interference changes for each light emission color. Hence, although a light emitting apparatus that has an interference structure will seem to be white when viewed in a front direction, a color shift from white may increase when the apparatus is viewed in an oblique direction.

SUMMARY OF THE INVENTION

An aspect of the present invention is to provide a technique for improving the viewing angle characteristics of a light emitting apparatus that has an interference structure.

In consideration of the above problem, there is provided a light emitting apparatus that includes a first light emitting element for a first color and a second light emitting element for a second color whose wavelength is shorter than the wavelength of the first color, wherein the first light emitting element includes a first reflection layer, a first transparent insulating layer, a first transparent electrode layer, a first light emitting layer, and a first upper electrode layer in this order, the second light emitting element includes a second reflection layer, a second transparent electrode layer, a second light emitting layer, and a second upper electrode layer in this order, and the second reflection layer and the second transparent electrode layer are in contact with each other.

Further features of the present invention will become apparent from the following description of exemplary embodiments (with reference to the attached drawings).

BRIEF DESCRIPTION OF THE DRAWINGS

FIG. 5 is a graph for explaining characteristics of dopants of a light emitting layer of Example 1;

DESCRIPTION OF THE EMBODIMENTS

Figure 1:
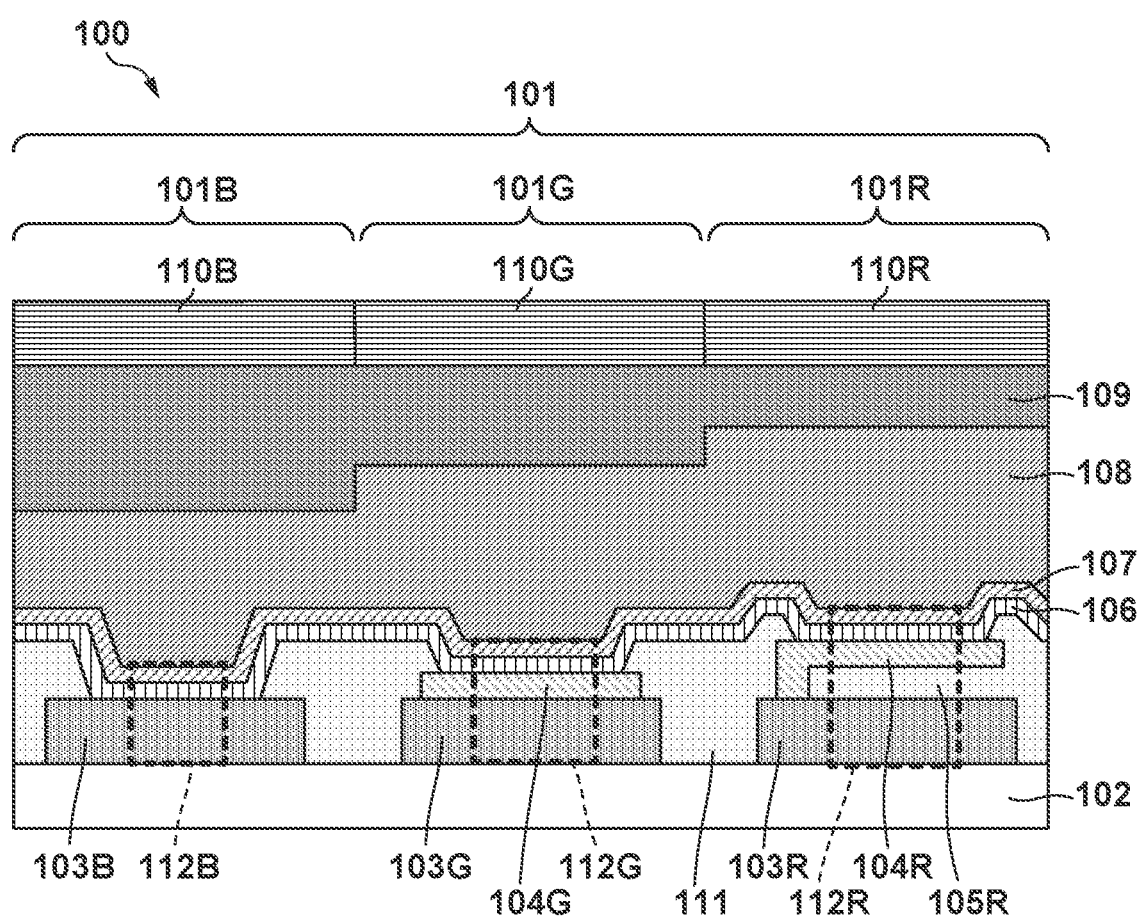
FIG. 1 is a view for explaining an example of a sectional structure of a light emitting apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the following description, the dimensions and ratios of elements in the drawings can be different from those in practice. In addition, in relation to parts not particularly illustrated or written in this specification, techniques well known or publicly known in the related art may be applied.

First Embodiment

Figure 2:
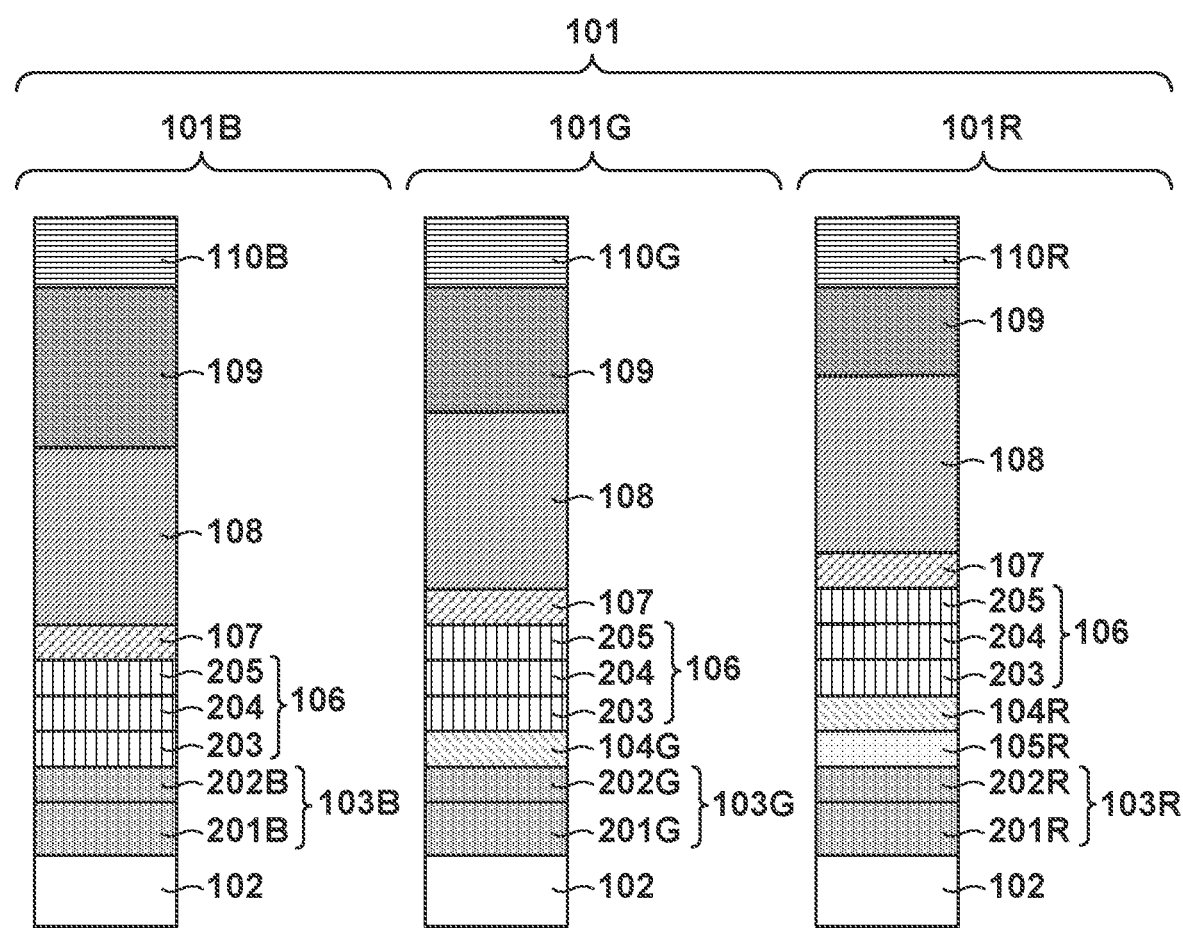
FIG. 2 is a view for explaining a detailed layer structure of the light emitting apparatus according to the first embodiment.

A light emitting apparatus 100 according to the first embodiment of the present invention will be described with reference to FIGS. 1 and 2. The light emitting apparatus 100 includes a pixel array in which a plurality of pixels are arranged in an array. FIG. 1 is a sectional view of a single pixel 101 included in the light emitting apparatus 100. FIG. 2 is a view for explaining the layer structure of each of three subpixels 101B, 101G, and 101R that form the single pixel 101. Although the three subpixels 101B, 101G, and 101R are aligned in a single array in FIG. 1, the arrangement of the subpixels is not limited to this. The subpixels 101B, 101G, and 101R are subpixels for emitting blue light, green light, and red light, respectively. Hence, the subpixels 101B, 101G, and 101R will be referred to as the blue subpixel 101B, the green subpixel 101G, and the red subpixel 101R, respectively.

Reflective electrode layers 103B, 103G, and 103R are arranged on a substrate 102. The reflective electrode layers 103B, 103G, and 103R will be collectively referred to as a reflective electrode layer 103. The following description of the reflective electrode layer 103 is applicable to each of the reflective electrode layers 103B, 103G, and 103R. The reflective electrode layers 103B, 103G, and 103R are included in the blue subpixel 101B, the green subpixel 101G, and the red subpixel 101R, respectively. The reflective electrode layers 103B, 103G, and 103R are electrically separated from each other by a pixel isolation film 111. In this manner, the pixel isolation film 111 has a function that defines each light emitting region. The pixel isolation film 111 is made of an insulating material such as $SiO_2$, SiN, a resin, or the like.

As shown in FIG. 2, the reflective electrode layer 103B can include a metal layer 201B arranged on the substrate and a barrier layer 202B arranged on the metal layer 201B. Alternatively, the reflective electrode layer 103B may include only the metal layer 201B and not include the barrier layer 202B.

The metal layer 201B is made of, for example, an aluminum alloy, a silver alloy, or the like whose film property has been stabilized by doping a very small amount of neodymium (Nd), copper (Cu), silicon (Si), palladium (Pd), or the like. The film thickness of the metal layer 201B may be, for example, 20 nm or more to 200 nm or less.

The barrier layer 202B is made of, for example, titanium (Ti), molybdenum (Mo), titanium nitride (TiN), tungsten (W), chromium (Cr), or the like. The material of the barrier layer 202B is selected from a metal that has a comparatively high work function, a high chemical stability, and a high melting point. The film thickness of the barrier layer 202B is, for example, 50 nm or less and selected so that a high reflection property of substantially 50% or more can be maintained in a visible light region.

The reflective electrode layer 103G can include a metal layer 201G arranged on the substrate and a barrier layer 202G arranged on the metal layer 201G. The reflective electrode layer 103R can include a metal layer 201R arranged on the substrate and a barrier layer 202R arranged on the metal layer 201R. The materials of the metal layers 201G and 201R may be similar to the material of the metal layer 201B. The materials of the barrier layers 202G and 202R may be similar to the material of the barrier layer 202B.

The red subpixel 101R includes a transparent insulating layer 105R on the reflective electrode layer 103R. The transparent insulating layer 105R is made of a transparent insulating material, for example, $SiO_2$ or the like. In the following description, the transparent insulating layer 105R may simply be referred to as a transparent insulating layer 105.

The red subpixel 101R includes a transparent electrode layer 104R on the transparent insulating layer 105R. The transparent electrode layer 104R is made of a conductive oxide material that has a high transmittance such as indium tin oxide (ITO), indium zinc oxide (IZO), aluminum zinc oxide (AZO), indium gallium zinc oxide (IGZO), or the like.

The refractive index of the transparent insulating layer 105R may be lower than the refractive index of the transparent electrode layer 104R. For example, the refractive index of the transparent insulating layer 105R may be 1.7 or less, and the refractive index of the transparent electrode layer 104R may be 1.7 or more. In addition, the refractive index of the transparent insulating layer 105 may be lower than the refractive index of a layer, among the layers forming the function layer 106, which is closest to the reflective electrode layer 103. The optical characteristics (for example, the refractive indices) of the transparent insulating layer 105R and the transparent electrode layer 104R may be measured by a spectroscopic ellipsometer using ellipsometry, a spectroscopic thickness gauge using spectroscopic reflectometry, or the like.

A part of the transparent electrode layer 104R penetrates through the transparent insulating layer 105R and is connected to the reflective electrode layer 103R. Hence, the transparent electrode layer 104R and reflective electrode layer 103R form the same node in a circuit. The edge of the transparent electrode layer 104R is covered by the pixel isolation film 111. Hence, the transparent electrode layer 104R is electrically isolated from the other subpixels.

The green subpixel 101G includes a transparent electrode layer 104G on the reflective electrode layer 103G. The material of the transparent electrode layer 104G may be similar to that of the transparent electrode layer 104R. The entire lower surface of the transparent electrode layer 104G is in contact with the upper surface of the reflective electrode layer 103G. The transparent electrode layers 104G and 104R will be collectively referred to as a transparent electrode layer 104. The edge of the transparent electrode layer 104G is covered by the pixel isolation film 111. Hence, the transparent electrode layer 104G is electrically isolated from the other subpixels.

A function layer 106 is arranged on the reflective electrode layer 103B, the transparent electrode layer 104G, the transparent electrode layer 104R, and the pixel isolation film 111. The function layer 106 is arranged to be shared by the blue subpixel 101B, the green subpixel 101G, and the red subpixel 101R. The function layer 106 includes a light emitting layer that emits white light. The function layer 106 may be made of an inorganic material or an organic material. A case in which the function layer 106 is made of an organic material will be described below.

As shown in FIG. 2, if the reflective electrode layer 103 is to be an anode, the function layer 106 may include, in the order closest from the substrate 102, a hole transport layer 203, a light emitting layer 204, and an electron transport layer 205. Also, the function layer 106 may include a hole injection layer below the hole transport layer 203 and an electron blocking layer between the hole transport layer 203 and the light emitting layer 204. The function layer 106 may further include a hole blocking layer between the light emitting layer 204 and the electron transport layer 205 and include an electron injection layer on the electron transport layer 205. The light emitting layer 204 may be a single layer or a layer formed by stacking a plurality of layers for each light emission color.

The electron transport layer 205 can be made of a known electron transport material, for example, a phenanthroline derivative, a quinolinol complex, or the like. In a case in which a hole blocking layer is included between the light emitting layer 204 and the electron transport layer 205, the hole blocking layer may be made of a wide bandgap material such as polycyclic aromatic hydrocarbon, heterocyclic aromatic series, or the like.

The hole transport layer 203 can be made of a known hole transport material, for example, a triarylamine derivative, a carbazole derivative, thiophane derivative, or the like. In a case in which an electron blocking layer is included between the hole transport layer 203 and the light emitting layer 204, the electron blocking layer may be made of a material whose LUMO level is lower (the absolute value is smaller) than that of the light emitting layer 204, particularly, for example, a carbazole derivative or a triarylamine derivative. If a hole injection layer is to be included below the hole transport layer 203, the hole injection layer may be made of a material with a high electron withdrawing property such as molybdenum oxide, $F_4$-TCNQ (tetracyanoquinodimethane), or the like.

The light emitting layer 204 may be a single layer formed to emit white light by adjusting the concentration of three kinds of dopants, which are the red light emitting dopant, the green light emitting dopant, and the blue light emitting dopant. Alternatively, the light emitting layer 204 may be a layer formed by stacking a red and green light emitting layer and a blue light emitting layer. The red and green light emitting layer contains at least green light emitting molecules and red light emitting molecules. Each light emitting layer can be formed by performing vapor co-deposition of the light emitting molecules of the respective colors on a host material at a predetermined doping concentration. For example, in the blue light emitting layer, the host material contains the blue dopant at a concentration of 0.1 wt % to 10 wt %. In the red and green light emitting layer, the host material contains the green light emitting molecules at a concentration of 0.5 wt % to 10 wt % and the red light emitting molecules at a concentration of 0.5 wt % to 5 wt %.

The emission peak of a blue light emitting molecule can be 440 nm to 480 nm. The emission peak of a green light emitting molecule can be 515 nm to 550 nm. The emission peak of a red light emitting molecule can be 600 nm to 640 nm. Each light emitting molecule can be a fluorescent light emitting material, a phosphorescent light emitting material, a delayed fluorescence material, or the like. The host material of the light emitting layer 204 can be a polycyclic compound or a heterocyclic compound such as an anthracene derivative, a pyrene derivative, a carbazole derivative, an amine system derivative, or the like. The host material may also be a light emitting material suitable for light emitting molecules. For example, if the host material is a host material suitable for causing blue light emitting molecules to emit light, it can also be used as a host material of the red and green light emitting layer. A spacer that adjusts the emission balance of the light emitting layer may be included between the red and green light emitting layer and the blue light emitting layer.

An upper electrode layer 107 is arranged on the function layer 106. The upper electrode layer 107 is arranged to be shared by the blue subpixel 101B, the green subpixel 101G, and the red subpixel 101R. The upper electrode layer 107 may be made of a transparent conductive oxide material such as ITO, IZO, or the like or may be made of a thin metal film. A thin metal film with a high reflectance may be used to improve the color purity by a microresonator effect. In a case in which a thin metal film is to be used, an Ag alloy thin film containing an alkaline earth metal such as magnesium (Mg), calcium (Ca), or the like may be used or Ag may be solely used.

A transparent sealing layer 108 is arranged on the upper electrode layer 107. The transparent sealing layer 108 is arranged to be shared by the blue subpixel 101B, the green subpixel 101G, and the red subpixel 101R. The transparent sealing layer 108 protects the organic light emitting elements from moisture and oxygen from the outside. The transparent sealing layer 108 is made of a material with very low oxygen and moisture transmission. The transparent sealing layer 108 can be made of a single layer of a silicon nitride film (SiN), a silicon oxide film ($SiO_2$), aluminum oxide or a multilayer film made of these films. Furthermore, the sealing performance of the transparent sealing layer 108 may be improved by setting a multilayer film arrangement in which a resin layer is sandwiched in between sealing layers in the manner of transparent sealing layer/resin layer/transparent sealing layer.

The transparent sealing layer 108 can have a function of protecting the light emitting elements in the formation process of a planarizing layer 109 and color filters 110R, 110G, and 110B. From the point of view of optical characteristics and membrane stress, the film thickness of the transparent sealing layer 108 can be 10 nm or more to 10 μm or less.

The planarizing layer 109 is arranged on the transparent sealing layer 108. The planarizing layer 109 is arranged to be shared by the blue subpixel 101B, the green subpixel 101G, and the red subpixel 101R. The upper surface of the planarizing layer 109 is flatter than the lower surface of the planarizing layer 109. The planarizing layer 109 may be omitted in a case in which the upper surface of the transparent sealing layer 108 is sufficiently flat.

In the blue subpixel 101B, the color filter 110B is arranged on the planarizing layer 109. The color filter 110B selectively transmits blue light. In the green subpixel 101G, the color filter 110G is arranged on the planarizing layer 109. The color filter 110G selectively transmits green light. In the red subpixel 101R, the color filter 110R is arranged on the planarizing layer 109. The color filter 110R selectively transmits red light. The color filters 110B, 110G, and 110R will be collectively referred to as color filters 110.

A resin layer for protecting the uppermost surface of the light emitting apparatus 100 and a transparent protection substrate such as glass or plastic may be arranged on the color filters 110. The light emitting apparatus 100 can include, in addition to the pixels 101 described above, a circuit (not shown) for driving the pixels 101 and wiring lines for supplying power to the reflective electrode layer 103 and the upper electrode layer 107.

A blue light emitting element 112B is formed by a portion, of the blue subpixel 101B, from the reflective electrode layer 103B to the upper electrode layer 107. A green light emitting element 112G is formed by a portion, of the green subpixel 101G, from the reflective electrode layer 103G to the upper electrode layer 107. A red light emitting element 112R is formed by a portion, of the red subpixel 101R, from the reflective electrode layer 103R to the upper electrode layer 107.

The light emitting element 112R includes the reflective electrode layer 103R, the transparent insulating layer 105R, the transparent electrode layer 104R, the function layer 106, and the upper electrode layer 107 in this order. The upper and lower layers are in contact with each other in this layer structure. The function layer 106 includes the light emitting layer 204. Of the light emitting layer 204, the portion included in the light emitting element 112R can be regarded to be the light emitting layer of the light emitting element 112R. Of the upper electrode layer 107, the portion included in the light emitting element 112R can be regarded as the upper electrode layer of the light emitting element 112R.

The light emitting element 112G includes the reflective electrode layer 103G, the transparent electrode layer 104G, the function layer 106, and the upper electrode layer 107 in this order. The upper and lower layers are in contact with each other in this layer structure. For example, the reflective electrode layer 103G and the transparent electrode layer 104G are in contact with each other. The function layer 106 includes the light emitting layer 204. Of the light emitting layer 204, the portion included in the light emitting element 112G can be regarded as the light emitting layer of the light emitting element 112G. Of the upper electrode layer 107, the portion included in the light emitting element 112G can be regarded as the upper electrode layer of the light emitting element 112G.

The light emitting element 112B includes the reflective electrode layer 103B, the function layer 106, and the upper electrode layer 107 in this order. The upper and lower layers are in contact with each other in this layer structure. The function layer 106 includes the light emitting layer 204. Of the light emitting layer 204, the portion included in the light emitting element 112B can be regarded as the light emitting layer of the light emitting element 112B. Of the upper electrode layer 107, the portion included in the light emitting element 112B can be regarded as the upper electrode layer of the light emitting element 112B. The light emitting element 112B does not include the transparent electrode layer between the reflective electrode layer 103B and the light emitting layer 204.

The distance between the reflective electrode layer 103B and the light emitting layer 204 is shorter than the distance between the reflective electrode layer 103G and the light emitting layer 204. The distance between the reflective electrode layer 103G and the light emitting layer 204 is shorter than the distance between the reflective electrode layer 103R and the light emitting layer 204. The distance between the upper electrode layer 107 and the reflective electrode layer 103B is shorter than the distance between the reflective electrode layer 103G and the upper electrode layer 107. The distance between the reflective electrode layer 103G and the upper electrode layer 107 is shorter than the distance between the reflective electrode layer 103R and the upper electrode layer 107.

The interference design of each pixel 101 will be described next. The film thicknesses of the transparent electrode layer 104, the transparent insulating layer 105R, and the function layer 106 are set so that the blue subpixel 101B, the green subpixel 101G, and the red subpixel 101R will have blue, green, and red resonance peaks, respectively. In the first embodiment, the light emitting layer 204 emits white light. In the blue subpixel 101B, the layer structure from the light emitting layer 204 to the reflective electrode layer 103B is formed so as to have an interference film thickness which is suitable for blue. More specifically, letting z be an optical path length and m be an order of interference, each layer of the blue subpixel 101B will have a film thickness that satisfies $$z=(2m\pi-\varphi_a)\times(\lambda/4\pi) \quad (1)$$

where λ is a dominant wavelength of an emission spectrum of light emitted from the light emitting element 112B. m is an integer. $\varphi_a$ is a reflection phase of the reflective electrode layer 103B with respect to the dominant wavelength λ. Although the wavelength λ that satisfies equation (1) can be increased the most, the wavelength λ whose value falls within the range of a value shifted by ±λ/8 can also be increased. That is, each layer of the blue subpixel 101B can satisfy $$z=(2m\pi-\varphi_a)\times(\lambda/4\pi)\pm\lambda/8 \quad (1')$$

In a case in which the upper electrode layer 107 is a thin metal film with high reflecting properties, each layer of the blue subpixel 101B can increase the dominant wavelength of the light emitted by the light emitting element 112B in a case in which each layer of the blue subpixel 101B has a film thickness that satisfies $$L=(2m\pi-\Phi)\times(\lambda/4\pi) \quad (2)$$

where L is the optical path length between the reflective electrode layer and the upper electrode layer and m is the order of interference. Note that L is the optical path length between the reflective electrode layer 103B and the upper electrode layer 107. λ is the dominant wavelength of the emission spectrum of light emitted from the light emitting element 112B. m is the order of interference and an integer. More specifically, m can be 0 or 1. Φ is the sum of reflection phases of the interface of the reflective electrode layer 103B and the interface of the upper electrode layer 107 with respect to the dominant wavelength λ. Although the wavelength λ that satisfies equation (2) can be increased the most, the wavelength λ whose value falls within the range of a value shifted by ±λ/8 can also be increased. That is, each layer of the blue subpixel 101B can satisfy $$L=(2m\pi-\Phi)\times(\lambda/4\pi)\pm\lambda/8 \quad (2')$$

Although the blue subpixel 101B has been described above, red light and green light can be increased for the green subpixel 101G and the red subpixel 101R, respectively, by satisfying equation (1') or equation (2'). The dominant wavelength λ is a wavelength emitted from the light emitting element of each subpixel and has a wavelength range of 420 nm to 500 nm in the case of a blue region, 500 nm to 560 nm in the case of the green region, and 590 nm to 680 nm in the case of the red region. In particular, since the wavelength regions of the blue subpixel 101B and the green subpixel 101G are close to each other in a case in which m=0, the dominant wavelengths λ of these regions may be set to the same value or a value close to the middle of the blue region and the green region. In such a case, the different light emitting subpixels can be created for blue and green by separating the colors by using spectroscopic members such as color filters or the like.

Note that the microresonator effect is maximized when both equation (1) and equation (2) are satisfied simultaneously. In addition, the interference condition for satisfying equation (2) may be confirmed by measuring the resonant wavelength from the reflectance spectrum obtained by using spectroscopic reflectometer by spectroscopic reflectometry. For example, whether it has been designed so that resonance occurs in a specific wavelength region can be confirmed based on the fact that a resonant wavelength will have a spectral shape in which the reflectance will have a minimum value.

Figure 3:
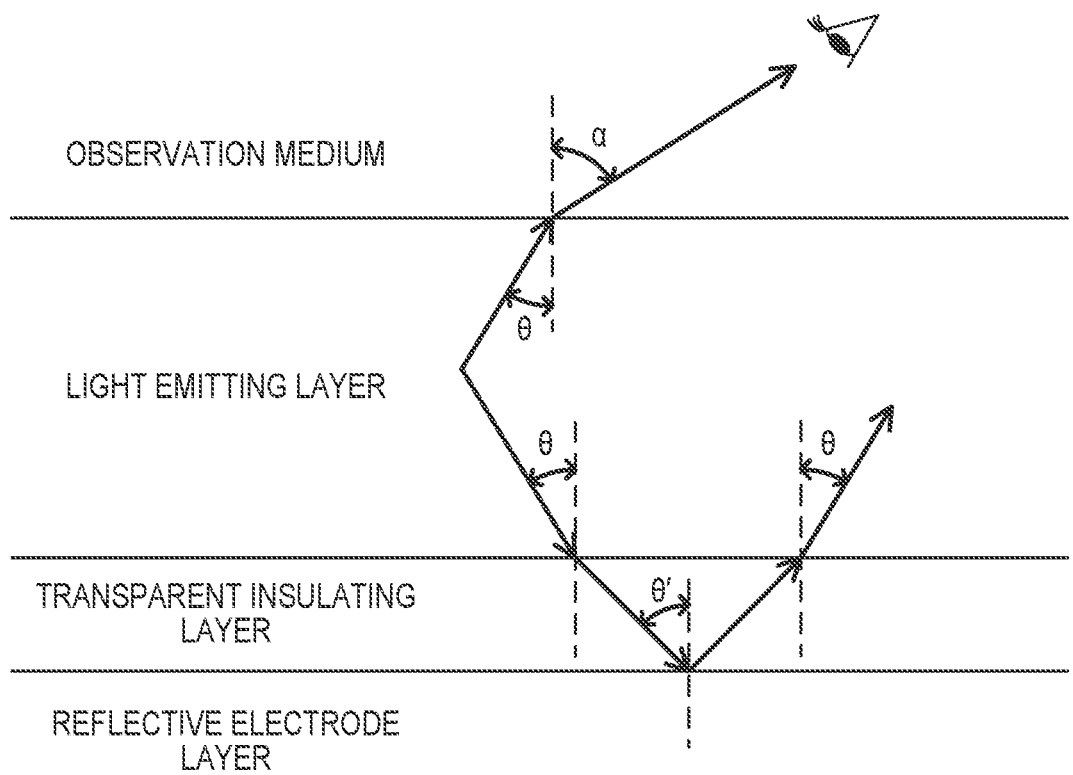
FIG. 3 is a view for explaining an interference structure.

In the above-described light emitting apparatus 100, since the light emitting element 112G and the light emitting element 112R have different layer structures, the red subpixel 101R and the green subpixel 101G have different interference effects from each other with respect to the viewing angle. Light emitted isotropically from the light emitting layer 204 includes light that will enter the reflective electrode layer 103 obliquely. An angle α of light emitted to the atmosphere from a subpixel can be guided based an angle θ of radiation from the light emitting layer 204 and the refractive index of each layer in accordance with Snell's law. More specifically, as shown in FIG. 3, let α be an angle observed by a user of the light emitting apparatus 100, θ be an angle of light radiation (angle of emergence) from the light emitting layer, and θ' be the angle of incidence of light that enters the reflective electrode layer. Also, let $N_{em}$ be the refractive index of the light emitting layer, $N_{med}$ be the refractive index of the transparent electrode layer, and $N_{air}$ be the refractive index of an observation medium (for example, the atmosphere). At this time the following is established.

$$N_{air}\times\sin\alpha = N_{em}\times\sin\theta = N_{emd}\times\sin\theta' \quad (3)$$

When equation (3) is modified, $\sin \theta' = (N_{air}/N_{med}) \times \sin \alpha$ is established. That is, the angle θ' of light incidence to the interface of the reflective electrode layer changes in accordance with the refractive index $N_{med}$ of the medium present above the reflective electrode layer.

The angle θ' of light incidence to the interface of the reflective electrode layer increases as the refractive index of the medium above the reflective electrode layer decreases. In addition, the angle θ' of light incidence to the interface of the reflective electrode layer decreases as the refractive index of the medium above the reflective electrode layer increases. For each subpixel, the interference is designed so that the resonant wavelength suitable for the color to be emitted will increase in accordance with the emission wavelength to be emitted in the front direction. In a case in which the optical path difference of the interference with respect to the front direction is designed to be n×d (n is a refractive index and d is a physical film thickness), the optical path difference with respect to the front direction will decrease since the optical path difference of interference with respect to a given angle β will be n×d×cos β. That is, the resonant wavelength in the oblique direction will become shorter than the resonant wavelength in the front direction.

Hence, the degree of a reflection interference effect due to the viewing angle of the red subpixel 101R in which the transparent insulating layer 105R as a low refractive index layer is arranged on the reflective electrode layer 103R will shift greatly to the short wavelength side compared to the green subpixel 101G. Hence, when observed in an oblique direction, the interference intensity of the light emitting element in the oblique direction will degrade more than the light to be obtained in the front direction for each subpixel. Furthermore, when viewed obliquely, the intensity of a color (red) of a long wavelength will greatly degrade more than that of colors (blue, green) of a short wavelength. As a result, since the intensities on the side of a long wavelength which has a high visibility and high degree of visual recognition of color change can be reduced, the balance of white in the oblique direction will be less likely to become distorted, and it will be possible to suppress a white color shift from occurring.

Figure 4A:
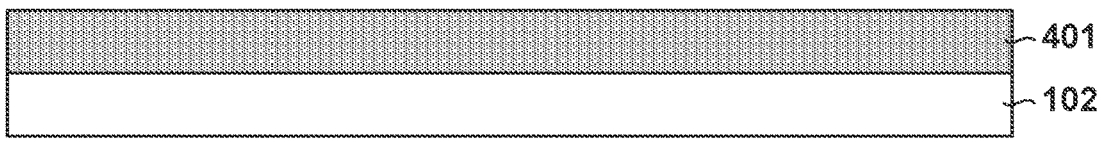
FIGS. 4A to 4F are views for explaining an example of a method of manufacturing the light emitting apparatus according to the first embodiment.

Next, a method of manufacturing the light emitting apparatus 100 will be described with reference to FIGS. 4A to 4F. A known method can be used for parts which are not described in FIGS. 4A to 4F. As shown in FIG. 4A, a metal film 401 is formed on the substrate 102 by using a material for the reflective electrode layer 103. For example, after depositing a metal layer 201 on the entire substrate 102 by sputtering, a barrier layer 202 is deposited by sputtering or vacuum vapor deposition in a state in which a vacuum is maintained or in an inert gas state to avoid exposure to the atmosphere. The formation of the barrier layer 202 may also be omitted.

Figure 4B:
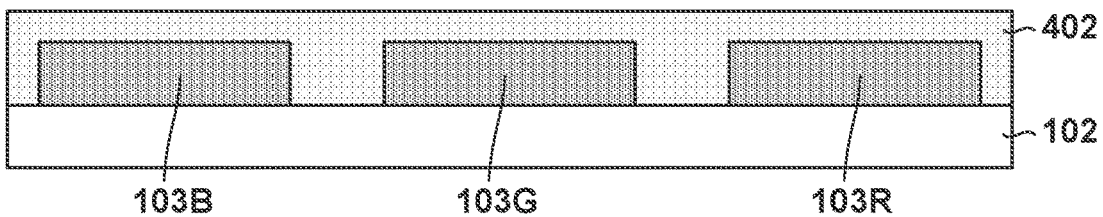

Next, the metal film 401 is coated with a resist film, and the resist film is patterned by photolithography. Next, the metal film 401 is etched by dry etching or wet etching to form the reflective electrode layers 103B, 103G, and 103R from the metal film 401. Subsequently, the resist film is removed, and an insulating film 402 is deposited at 22 nm by using a material (for example, SiO$_2$) for the transparent insulating layer 105R. After the completion of this process, the structure shown in FIG. 4B is obtained.

Figure 4C:
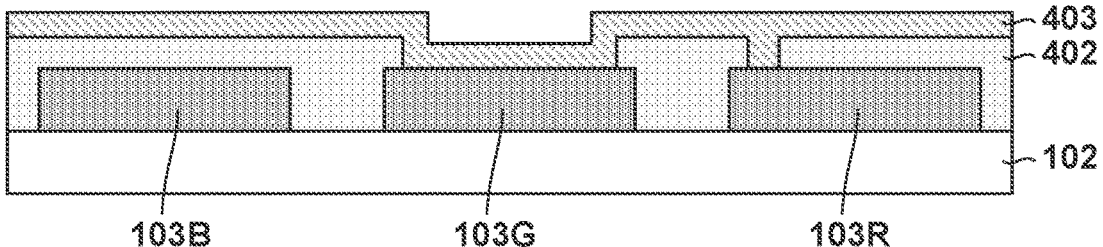

Next, resist film coating is performed, the resist film is patterned by photolithography, and the insulating film 402 is patterned by dry etching. This patterning operation forms an opening in the insulating film 402 so that a large portion (for example, 90% of the portion including the center of the upper surface) of the upper surface of the reflective electrode layer 103G and a portion (for example, 5% of the portion near the edge of the upper surface) of the upper surface of the reflective electrode layer 103R will be exposed. Of the insulating film 402, a portion above the reflective electrode layer 103R will become the transparent insulating layer 105R. Subsequently, the resist film is removed, and a 16-nm transparent conductive film 403 is formed on the insulating film 402 by using a material (for example, ITO) for the transparent electrode layer 104 and performing sputtering. The structure shown in FIG. 4C is obtained after the completion of this process. Although the edge of the reflective electrode layer 103G remains covered by the insulating film 402 in this example, the insulating film 402 may be removed from the entire upper surface of the reflective electrode layer 103G.

Subsequently, resist film coating is performed, the resist film is patterned by photolithography, the transparent conductive film 403 is patterned by using the remaining resist film, and the resist film is removed thereafter. This patterning removes the transparent conductive film 403 from portions other than the portion above the reflective electrode layer 103R and the portion above the reflective electrode layer 103G. Of the transparent conductive film 403, the portion remaining on the reflective electrode layer 103R becomes the transparent electrode layer 104R. Of the transparent conductive film 403, the portion remaining on the reflective electrode layer 103G becomes the transparent electrode layer 104G.

Figure 4D:
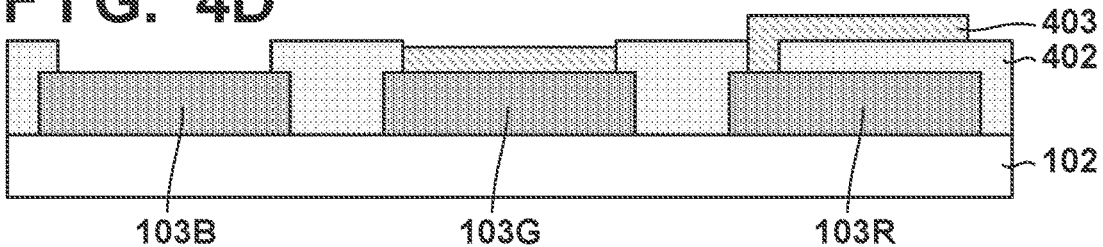

Next, resist film coating is performed, the resist film is patterned by photolithography, the insulating film 402 is patterned by dry etching, and the resist film is removed. This patterning forms an opening on the insulating film 402 so as to expose a large portion (for example, 90% of the portion including the center of the upper surface) of the upper surface of the reflective electrode layer 103B. The structure shown in FIG. 4D is obtained by the completion of this process. Although the edge of the reflective electrode layer 103B remains covered by the insulating film 402 in this example, the insulating film 402 may be removed from the entire upper surface of the reflective electrode layer 103B.

Figure 4E:
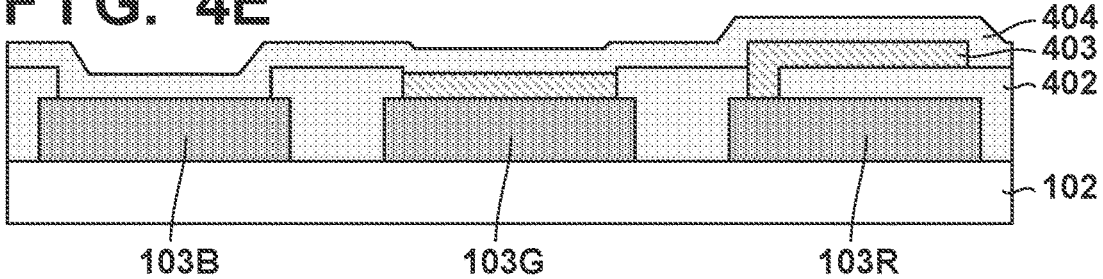

Subsequently, a 50-nm insulating film 404 is formed by depositing, overall, a material (for example, SiO$_2$) for the pixel isolation film 111. The insulating film 404 may be made of the same material as the insulating film 402 in consideration of the deposition process. Alternatively, the insulating film 404 may be made of a material, for example, SiN, which is different from the material of the insulating film 402. The structure shown in FIG. 4E is obtained after the completion of this process.

Figure 4F:
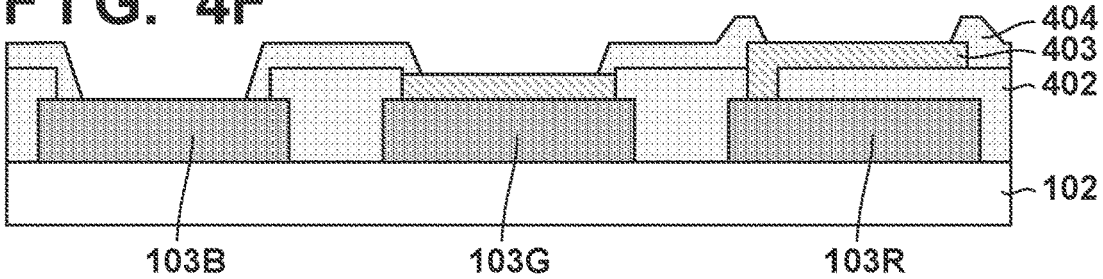

Subsequently, resist film coating is performed, the resist film is patterned by photolithography, and portions, of the insulating film 404, above the reflective electrode layers 103B and 103G and the transparent electrode layer 104R are removed. The remaining portion of the insulating film 404 becomes the pixel isolation film 111. The structure of FIG. 4F is obtained after the completion of this process.

Subsequently, the light emitting apparatus 100 is manufactured by sequentially forming the function layer 106, the upper electrode layer 107, the transparent sealing layer 108, the planarizing layer 109, and the color filters 110. The function layer 106 may be formed by vacuum vapor deposition or an inkjet method. The upper electrode layer 107 may be formed by sputtering or vacuum vapor deposition.

According to the above-described method, layers for adjusting the optical interference, that is, the transparent insulating layer 105 and the transparent electrode layer 104 can be formed by only performing deposition by sputtering. As a result, the controllability of the film thickness improves compared to a method in which the thicknesses of these layers are controlled by an etching process. In addition, according to the above-described method, the number of processes can be reduced compared to a case in which the thickness of each film to be used for adjusting the optical interference is changed for each subpixel, and thus the number of masks used for patterning can be reduced. As a result, it will be possible to suppress the cost and a reduction in the yield.

Second Embodiment

A light emitting layer 204 emitted white light in the first embodiment. Alternatively, light of a different color will be emitted by each subpixel in the second embodiment. More specifically, of the light emitting layer 204, a portion included in a red subpixel 101R will emit red light. Of the light emitting layer 204, a portion included in a green subpixel 101G will emit green light. Of the light emitting layer 204, a portion included in a blue subpixel 101B will emit blue light. This kind of light emitting layer 204 may be formed by a method for coating different colors by vapor deposition using a deposition mask, a method for coating different colors by an inkjet method, coating different colors by photolithography, or the like. Since the light emitting layer 204 itself will emit light of each color, color filters 110 may be omitted in the second embodiment.

Other Embodiments

A modification of the materials for the respective layers according to the first embodiment and the second embodiment described above will be described hereinafter. A substrate 102 can be made of quartz, glass, a silicon wafer, a resin, or the like. Also, a light emitting apparatus 100 can include switching elements such as transistors and wiring lines on the substrate 102, and include an insulating layer above these transistors and wiring lines. The material of the insulating layer can be silicon oxide, silicon nitride, a resin such as a polyimide resin, or the like.

A reflective electrode layer 103 can function as an anode of a light emitting element 112, and an upper electrode layer 107 can function as a cathode of the light emitting element 112. The electrode with the higher potential will be set as the anode, and the other electrode will be set as the cathode. Alternatively, an electrode that supplies holes to a light emitting layer 204 can be set as the anode and an electrode that supplies electrons can be set as the cathode. The reflective electrode layer 103 can be made of, for example, chromium, aluminum, silver, titanium, tungsten, molybdenum, an alloy of these elements, a stacked layer of these elements, or the like.

On the other hand, the material of the upper electrode layer 107 can be an alkaline metal such as lithium, an alkaline earth metal such as calcium, a metal element such as aluminum, titanium, manganese, silver, lead, chromium, or the like, or a mixture including these elements. An alloy obtained by combining these metal elements can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) or the like can also be used. One kind of these electrode materials can be used alone or two or more kinds of these electrode materials can be used together. The upper electrode layer 107 can have a single-layer arrangement or a multi-layer arrangement. Silver can be used as the material for the upper electrode layer 107. Alternatively, a silver alloy may be used to suppress the aggregation of silver. Any ratio can be used as long as the aggregation of silver can be suppressed. For example, the ratio of the alloy can be 1:1.

A transparent sealing layer 108 can be a passivation film made of silicon nitride or the like. The transparent sealing layer 108 can be formed by conveying the upper electrode layer 107 to another chamber without breaking the vacuum, and using CVD to form a silicon nitride film at a thickness of 2 μm on the upper electrode layer. After the deposition by CVD, a protective layer may also be formed by atomic layer deposition (ALD).

Each color filter 110 can be formed by a high polymer. A planarizing layer 109 can be made of an organic compound and may be a low polymer or a high polymer. The planarizing layer 109 can also be arranged above and below each color filter 110, and the constituent materials for the upper layer and the lower layer may be the same or different in such a case. More specifically, the material of the planarizing layer 109 can be, for example, a polyvinylcarbazole resin, a polycarbonate resin, a polyester resin, an ABS resin, an acrylic resin, a polyimide resin, a phenol resin, an epoxy resin, a silicone resin, a urea resin, or the like.

The light emitting apparatus 100 can include a counter substrate on the planarizing layer 109. The counter substrate is referred to as a counter substrate since it is positioned in correspondence with the substrate 102. The constituent material of the counter substrate can be the same as the substrate 102.

A function layer 106 is an organic compound layer. The function layer 106 can be formed by dry processing such as vacuum vapor deposition, ion vapor deposition, sputtering, plasma processing, or the like. Wet processing in which a layer is formed by dissolving an organic compound in a suitable solvent and coating the substrate by a known coating method (for example, spin coating, dipping, casting, the LB method, a inkjet method, or the like) can also be performed alternatively to the dry processing. In a case in which deposition is to be performed by using a coating method, a film can be formed by combining an organic compound with a suitable binder resin. Although a polyvinylcarbazole resin, a polycarbonate resin, a polyester resin, an ABS resin, an acrylic resin, a polyimide resin, a phenol resin, an epoxy resin, a silicone resin, a urea resin, or the like can be raised as the binder resin, the binder resin is not limited to these resins. Also, only one kind of these binder resins may be used alone as a homopolymer or a copolymer or two or more kinds of binder resins may be mixed and used. Furthermore, a known additive such as a plasticizer, an anti-oxidant, a UV absorber, or the like may also be used together with the binder resin.

EXAMPLES AND COMPARATIVE EXAMPLES

Various kinds of examples of the light emitting apparatus 100 according to the first embodiment will be described hereinafter. Comparative examples of these examples will also be described.

Example 1

In Example 1, the light emitting elements 112B, 112G, and 112R were formed so as to use the materials and have the film thicknesses as shown in Table 1 as follows. The light emitting layer 204 was formed into a white light emitting layer by mixing a blue dopant, a green dopant, and a red dopant, which have fluorescence spectra as shown in FIG. 5, onto a host material by vapor co-deposition. Thereafter, the transparent sealing layer 108 of 2 μm was formed. Subsequently, each color filter 110 was formed on the transparent sealing layer 108, and a protective glass substrate was bonded on top of this by resin.

TABLE 1

| Example 1 | Red Subpixel 101R | Green Subpixel 101G | Blue Subpixel 101B |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 32 nm | 32 nm | 32 nm |
| Transparent Electrode Layer 104 (ITO) | 16 nm | 16 nm | N/A |
| Transparent Insulating Layer 105 (SiO$_2$) | 22 nm | N/A | N/A |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 0 | 0 | 0 |
| Dominant Wavelength λ | 610 nm | 540 nm | 480 nm |

Figure 6A:
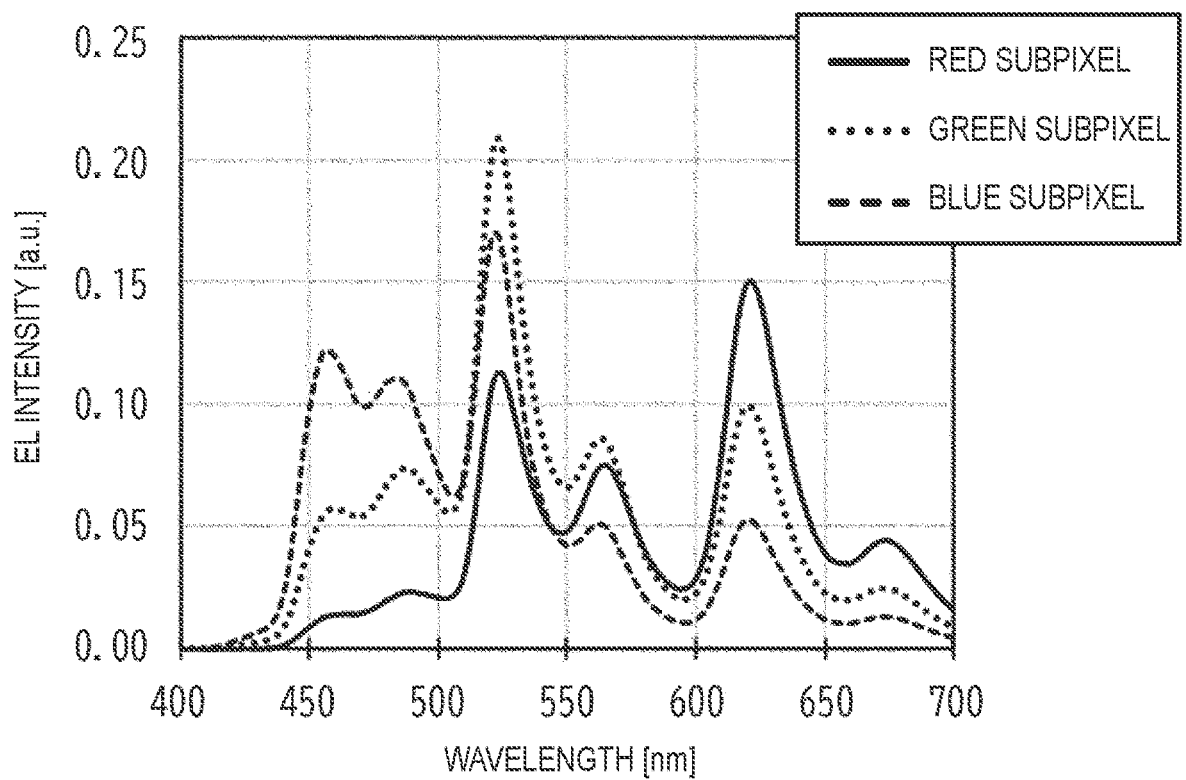
FIGS. 6A and 6B are graphs for explaining light spectra emitted by respective light emitting elements of Example 1.
Figure 6B:
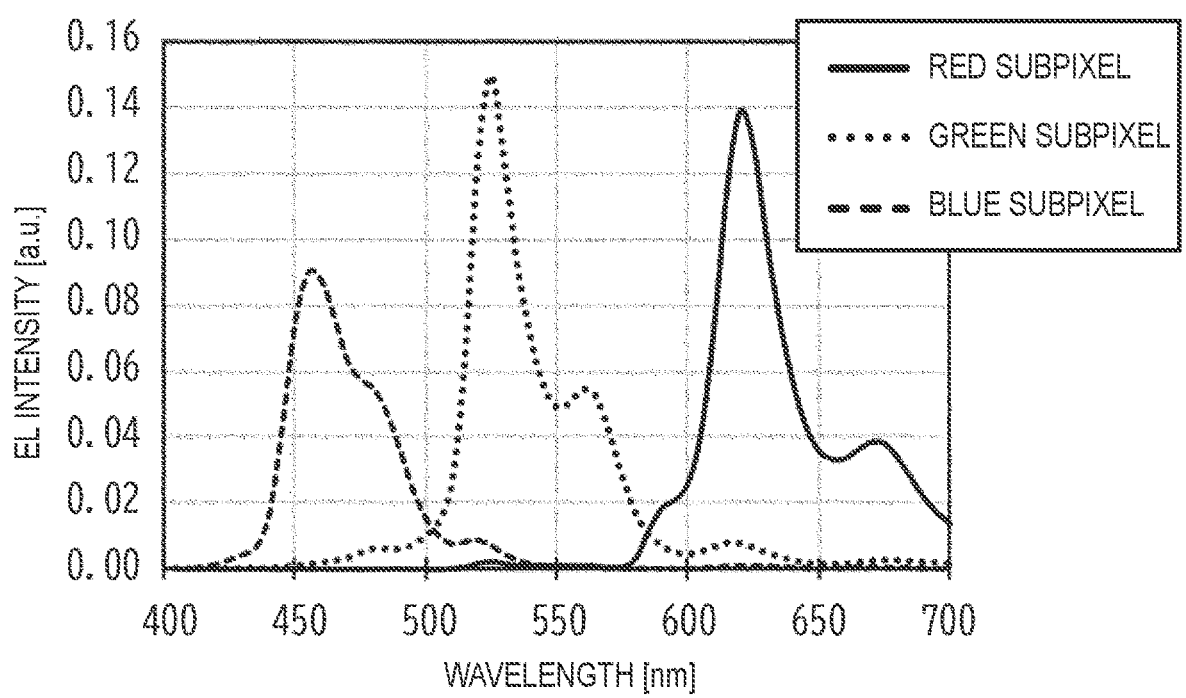
Figure 7:
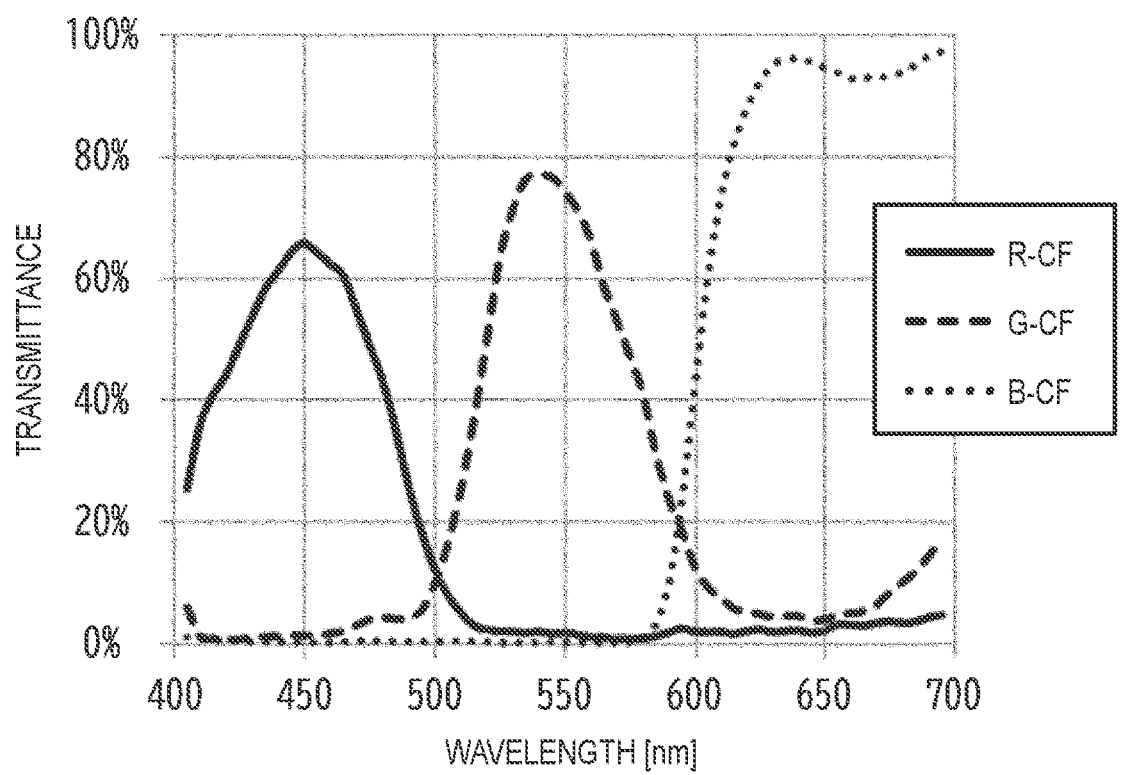
FIG. 7 is a graph for explaining transmission characteristics of respective color filters of Example 1.

As shown in Table 1, for each subpixel, the above-described equation (1) is satisfied and m of equation (2) becomes 0. FIG. 6A shows the EL spectrum of the light emitting element of each subpixel. It can be seen that the wavelength region suitable for the color to be emitted from each subpixel has been strengthened. FIG. 6B shows the EL spectrum of the light emitting element of each subpixel after a light beam has been transmitted through corresponding color filter 110. FIG. 7 shows the transmission characteristics of the respective color filters 110. It can be seen that by passing the light beams through the corresponding color filters 110, the intensity for transmitting a suitable wavelength can be increased, and the color purity and the light emission efficiency of each subpixel can be improved.

The color shift of the viewing angle was evaluated next. First, the light emission intensity of the subpixel of each color was adjusted so that a reference white can be obtained in the front direction. Next, the occurrence of a color shift when an observation is performed from a viewing angle of 50° with respect to the front (0°) was evaluated by using Δu'v'. Δu'v' represents the shift amount of each color observed from the viewing angle of 50° with respect to the reference white in the front direction (0°) of a CIE 1976 (u'v') color space. Assume that the values of u' and v' of the reference white in the front direction are u'0 and v'0, respectively, and the values of u' and v' of the color observed from the viewing angle of 50° are u'50 and v'50, respectively. In this case, since u'0−u'50=Δu' and v'0−v'50=Δv', Δu'v' can be represented as follows.

$$\Delta u'v' = \sqrt{((\Delta u')^2 + (\Delta v')^2)} \quad (4)$$

The evaluation result of Δu'v' in the viewing angle of 50° will be shown in Table 8 (to be described later).

Example 2

In Example 2, the light emitting elements 112B, 112G, and 112R were formed so as to use the materials and have the film thicknesses as shown in Table 2 as follows. In addition, in Example 2, m of equation (2) was arranged to be 1. Matters other than these are similar to those of Example 1. The evaluation result of Δu'v' in the viewing angle of 50° will be shown in Table 8 (to be described later).

TABLE 2

| Example 2 | Red Subpixel 101R | Green Subpixel 101G | Blue Subpixel 101B |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 135 nm | 135 nm | 135 nm |
| Transparent Electrode Layer 104 (ITO) | 48 nm | 48 nm | N/A |
| Transparent Insulating Layer 105 (SiO$_2$) | 55 nm | N/A | N/A |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 1 | 1 | 1 |
| Dominant Wavelength λ | 615 nm | 540 nm | 460 nm |

Example 3

In Example 3, the light emitting elements 112B, 112G, and 112R were formed so as to use the materials and have the film thicknesses as shown in Table 3 as follows. In contrast to Example 1, the green subpixel 101G does not include the transparent electrode layer 104G. Matters other than this are similar to those of Example 1. The evaluation result of Δu'v' in the viewing angle of 50° will be shown in Table 8 (to be described later). Since the green subpixel 101G does not include the transparent electrode layer 104G, the green subpixel 101G has a layer structure similar to that of the blue subpixel 101B.

TABLE 3

| Example 3 | Red Subpixel 101R | Green Subpixel 101G | Blue Subpixel 101B |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 44 nm | 44 nm | 44 nm |
| Transparent Electrode Layer 104 (ITO) | 16 nm | N/A | N/A |

TABLE 3-continued

| Example 3 | Red Subpixel 101R | Green Subpixel 101G | Blue Subpixel 101B |
|---|---|---|---|
| Transparent Insulating Layer 105 (SiO$_2$) | 10 nm | N/A | N/A |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 0 | 0 | 0 |
| Dominant Wavelength λ | 615 nm | 535 nm | 535 nm |

Comparative Example 1

Comparative Example 1 differs from Example 1 in the point that the film thicknesses are as shown in Table 4 as follows. Other points are the same. The evaluation result of the color shift in the viewing angle of Comparative Example 1 will be shown in Table 8 (to be described later).

TABLE 4

| Comparative Example 1 | Red Subpixel 101R | Green Subpixel 101G | Blue Subpixel 101B |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 32 nm | 32 nm | 32 nm |
| Transparent Electrode Layer 104 (ITO) | 36 nm | 16 nm | N/A |
| Transparent Insulating Layer 105 (SiO$_2$) | N/A | N/A | N/A |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 0 | 0 | 0 |
| Dominant Wavelength λ | 610 nm | 540 nm | 480 nm |

Comparative Example 2

Comparative Example 2 differs from Example 1 in the point that the film thicknesses are as shown in Table 5 as follows. Other points are the same. The evaluation result of the color shift in the viewing angle of Comparative Example 2 will be shown in Table 8 (to be described later).

TABLE 5

| Comparative Example 2 | Red Subpixel 101R | Green Subpixel 101G | Blue Subpixel 101B |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 135 nm | 135 nm | 135 nm |
| Transparent Electrode Layer 104 (ITO) | 95 nm | 48 nm | N/A |
| Transparent Insulating Layer 105 (SiO$_2$) | N/A | N/A | N/A |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 1 | 1 | 1 |
| Dominant Wavelength λ | 615 nm | 540 nm | 460 nm |

Comparative Example 3

Comparative Example 3 differs from Example 1 in the point that the film thicknesses are as shown in Table 6 as follows. Other points are the same. The evaluation result of the color shift in the viewing angle of Comparative Example 3 will be shown in Table 8 (to be described later).

TABLE 6

| Comparative Example 3 | Red Subpixel 101R | Green Subpixel 101G | Blue Subpixel 101B |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 54 nm | 54 nm | 54 nm |
| Transparent Electrode Layer 104 (ITO) | 20 nm | 20 nm | 20 nm |
| Transparent Insulating Layer 105 (SiO$_2$) | 210 nm | 155 nm | 100 nm |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 1 | 1 | 1 |
| Dominant Wavelength λ | 620 nm | 525 nm | 455 nm |

Comparative Example 4

Comparative Example 4 differs from Example 1 in the point that the film thicknesses are as shown in Table 7 as follows. Other points are the same. The evaluation result of the color shift in the viewing angle of Comparative Example 4 will be shown in Table 8 (to be described later).

TABLE 7

| Upper Electrode Layer 107 | Upper Electrode Layer 107 | Upper Electrode Layer 107 | Upper Electrode Layer 107 |
|---|---|---|---|
| Upper Electrode Layer 107 (MgAg Alloy) | 10 nm | 10 nm | 10 nm |
| Electron Transport Layer 205 | 26 nm | 26 nm | 26 nm |
| Light Emitting Layer 204 | 20 nm | 20 nm | 20 nm |
| Hole Transport Layer 203 | 32 nm | 32 nm | 32 nm |
| Transparent Electrode Layer 104 (ITO) | N/A | N/A | 50 nm |
| Transparent Insulating Layer 105 ($SiO_2$) | N/A | N/A | 95 nm |
| Barrier Layer 202 (Ti) | 6 nm | 6 nm | 6 nm |
| Reflective Electrode Layer 103 (AlCu Alloy) | 100 nm | 100 nm | 100 nm |
| m of Equation (2) | 0 | 0 | 1 |
| Dominant Wavelength λ | 490 nm | 490 nm | 465 nm |

<Evaluation Result>

The evaluation results of the color shift in the viewing angles of Examples 1 to 3 and Comparative Examples 1 to 4 described above are shown in Table 8. It can be seen that the color shift due to the viewing angle decreases more in Examples 1 to 3 than in Comparative Examples 1 to 4.

TABLE 8

| Viewing angle of 50° | Δu' v' |
|---|---|
| Example 1 | 0.0205 |
| Example 2 | 0.0228 |
| Example 3 | 0.0224 |
| Comparative Example 1 | 0.0238 |
| Comparative Example 2 | 0.0269 |
| Comparative Example 3 | 0.0297 |
| Comparative Example 4 | 0.0398 |

<Applications of Light Emitting Apparatus According to Some Embodiments of Present Invention>

The light emitting apparatus according to the above-described embodiments of the present invention can be used as a component of a display apparatus or an illumination apparatus. Alternatively, the light emitting apparatus according to the above-described embodiments can be applied to an exposure light source of an electrophotographic image forming apparatus, a backlight of a liquid crystal display apparatus, a light emitting apparatus that includes color filters on a white light source, and the like. An electrophotographic printer includes, for example, a photosensitive member and a light emitting apparatus that applies light to this photosensitive member. The light emitting apparatus of this printer can be the light emitting apparatus of the above-described embodiments.

A display apparatus can be an image information processing apparatus that includes an image input unit for inputting image information from an area CCD, a linear CCD, a memory card, and the like and an information processing unit for processing the input information, and displays the input image on a display unit.

A display unit of an image capturing apparatus or an inkjet printer can have a touch panel function. The driving method of this touch panel function may employ an infrared method, a capacitance method, a resistive film method, or an electromagnetic induction method. The display apparatus can also be applied to a display unit of a multifunction printer.

Figure 8:
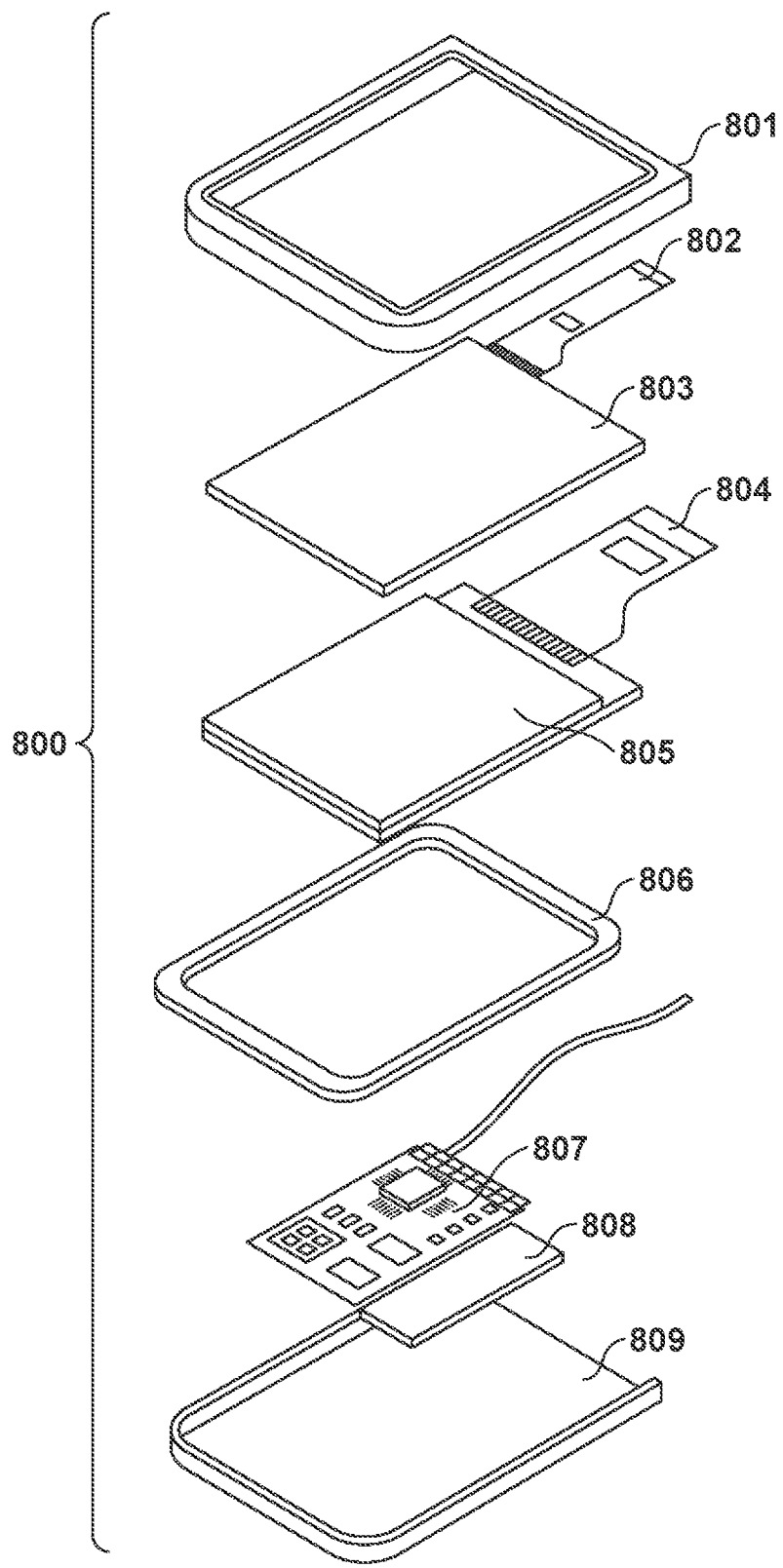
FIG. 8 is a view for explaining an example of the arrangement of a display apparatus according to some of the embodiments of the present invention.

FIG. 8 is a schematic view showing an example of a display apparatus according to some of the embodiments. A display apparatus 800 can include a touch panel 803, a display panel 805, a frame 806, a circuit board 807, and a battery 808 between an upper portion cover 801 and a lower portion cover 809. Flexible print circuits FPC 802 and 804 are connected to the touch panel 803 and the display panel 805. A transistor is printed on the circuit board 807. The battery 808 need not be arranged unless the display apparatus is a portable device, and may be arranged in another position even if the display apparatus is a portable device. The 800 includes a plurality of pixels, and at least one of these plurality of pixels includes the light emitting element of the light emitting apparatus according to the above-described embodiments and a transistor connected to this light emitting element.

The display apparatus according to the embodiments can be applied to a display unit of a portable terminal. In such a case, the display apparatus can have both a display function and an operation function. A mobile phone such as a smartphone or the like, a tablet, a head-mounted display, or the like can be raised as the portable terminal.

The display apparatus according to the embodiments can be applied to a display unit of an image capturing apparatus (a photoelectric conversion apparatus) that includes an optical unit including a plurality of lenses and an image capturing element that receives the light which has passed through the optical unit. The display unit of the image capturing apparatus can display an image captured by the image capturing element. The display unit can also be a display unit exposed outside the image capturing apparatus or a display unit arranged inside the viewfinder. The image capturing apparatus may be a digital camera or a digital video camera.

Figure 9A:
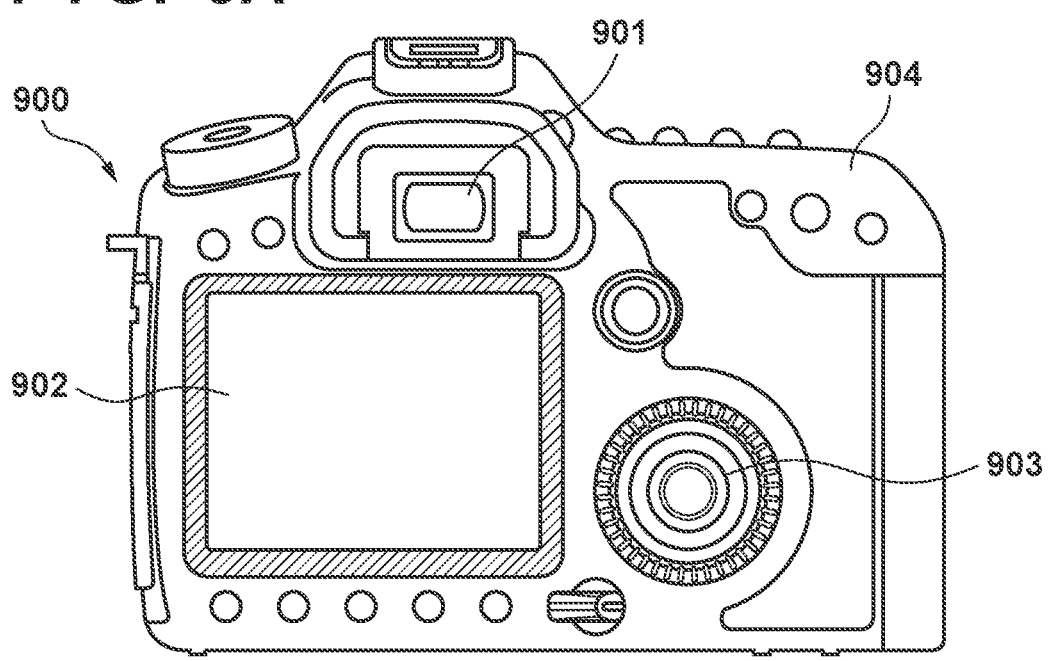
FIGS. 9A and 9B are views for explaining examples of the arrangements of an image capturing apparatus and an electronic device, respectively, according to some of the embodiments of the present invention.

FIG. 9A is a schematic view showing an example of an image capturing apparatus according to the embodiments. An image capturing apparatus 900 can include a viewfinder 901, a back surface display 902, an operation portion 903, and a housing 904. The viewfinder 901 can include the display apparatus according to the embodiments. In this case, the display apparatus may not only display an image to be captured, but also environment information, an image capturing instruction, and the like. The environment information may be information of the intensity of natural light, the direction of the natural light, the speed of the movement of an object, the possibility that the object is shielded by a shielding object, and the like.

Since the above-described light emitting apparatus includes an organic light emitting element, it has a high response speed. Hence, information can be displayed in a small amount of time that is suitable for image capturing. The display apparatus that employs an organic light emitting element can be used for an apparatus which requires high display speed.

The image capturing apparatus 900 includes an optical unit (not shown). The optical unit includes a plurality of lenses and forms an image on an image capturing element contained in the housing 904. The plurality of lenses can adjust the focus by adjusting their relative positions. This operation can also be performed automatically.

Figure 9B:
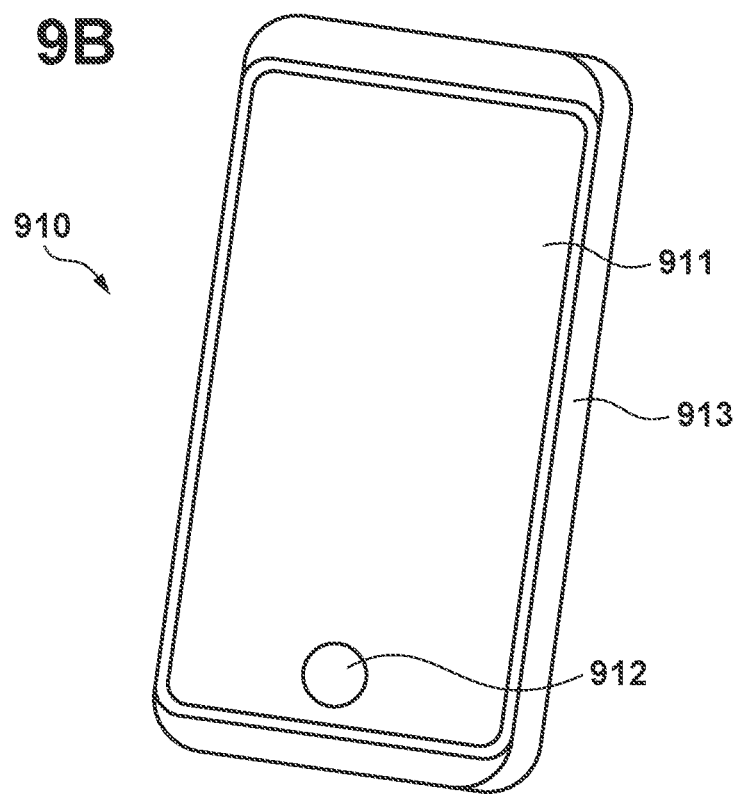

FIG. 9B is a schematic view showing an example of an electronic device according to the embodiments. An electronic device 910 includes a display unit 911, an operation portion 912, and a housing 913. The housing 913 can include a circuit, a printed board which includes the circuit, a battery, and a communication unit. The communication unit is used for communication with an external device. The operation portion 912 can be a button or a touch-panel-type reaction unit. The operation portion 912 can also be a biometric authentication unit that performs unlocking or the like by authenticating a fingerprint. The electronic device including the communication unit can also be regarded as a communication device. The electronic device can further have a camera function by including a lens and an image capturing element. An image captured by the camera function is displayed on the display unit 911. A smartphone, a notebook PC, and the like can be raised as the electronic device.

Figure 10A:
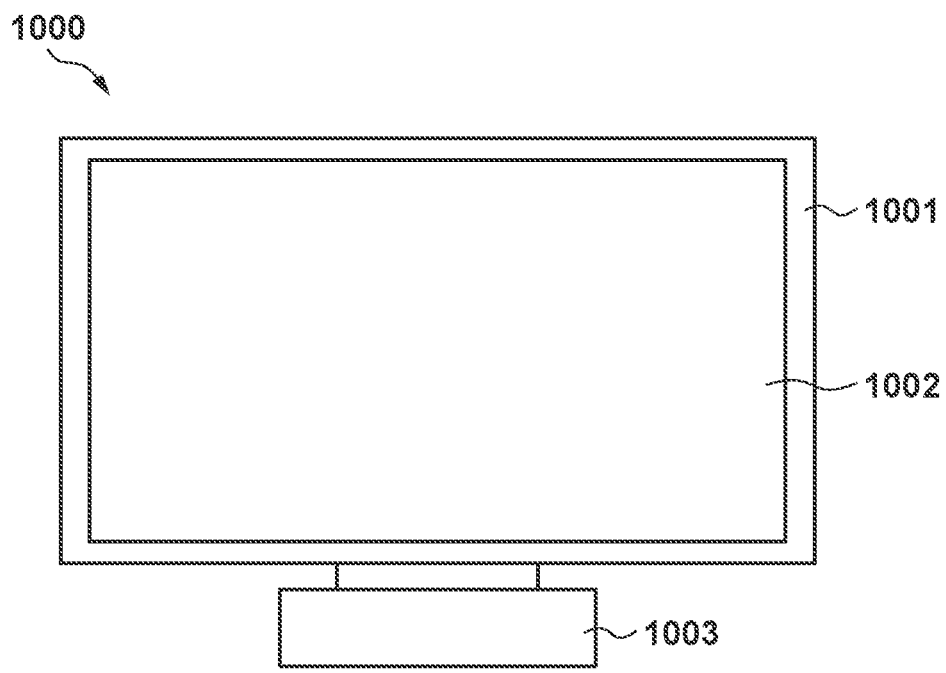
FIGS. 10A and 10B are views for explaining examples of the arrangements of display apparatuses according to some of the embodiments of the present invention.
Figure 10B:
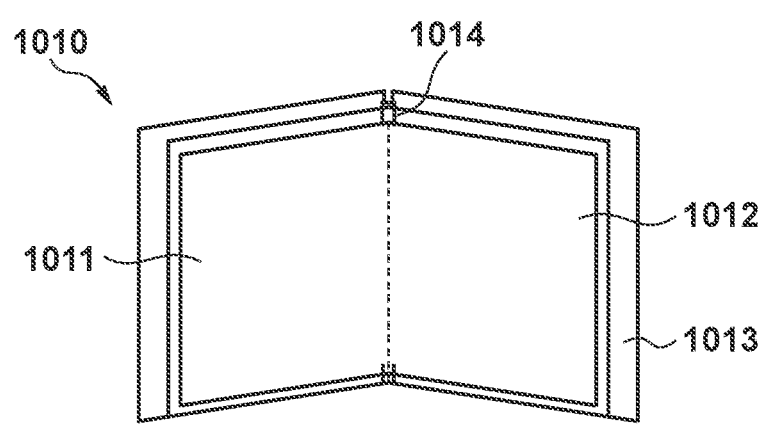

FIGS. 10A and 10B are schematic views showing examples of display apparatuses according to the embodiments. FIG. 10A shows a display apparatus such as a television monitor or a PC monitor. A display apparatus 1000 includes a frame 1001 and a display unit 1002. The light emitting apparatus according to the embodiments is applied to the display unit 1002.

The display apparatus 1000 also includes a base 1003 that supports the frame 1001 and the display unit 1002. The base 1003 is not limited to the form shown in FIG. 10A. For example, the lower side of the frame 1001 may also function as the base. In addition, the frame 1001 and the display unit 1002 may be bent. The radius of curvature in this case can be 5,000 mm or more to 6,000 mm or less.

FIG. 10B is a schematic view showing another example of a display apparatus according to the embodiments. A display apparatus 1010 shown in FIG. 10B is arranged so that it can be folded, that is, the display apparatus 1010 is a so-called foldable display apparatus. The display apparatus 1010 includes a display unit 1011, a display unit 1012, a housing 1013, and a bending point 1014. The light emitting apparatus according to the embodiments can be applied to the display unit 1011 and the display unit 1012. The display unit 1011 and the display unit 1012 can be one seamless display device. The display unit 1011 and the display unit 1012 can be divided from the bending point. The display unit 1011 and the display unit 1012 can display different images and can also display a single image together.

Figure 11A:
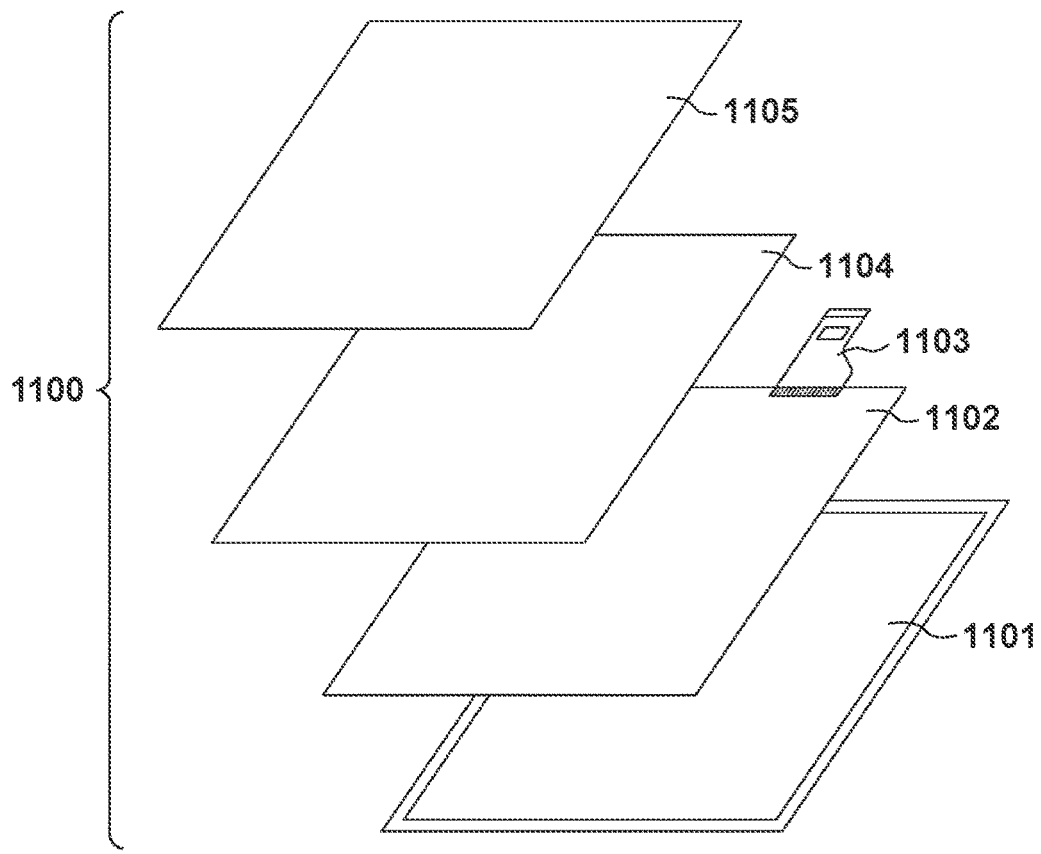
FIGS. 11A and 11B are views for explaining examples of the arrangements of an illumination apparatus and a moving body, respectively, according to some of the embodiments of the present invention.

FIG. 11A is a schematic view showing an example of an illumination apparatus according to the embodiments. An illumination apparatus 1100 can include a housing 1101, a light source 1102, a circuit board 1103, an optical film 1104, and a light diffusing unit 1105. The light source can include the light emitting apparatus according to the embodiments. The optical film 1104 transmits light emitted by the light source 1102. The optical film 1104 can be a filter that improves the color rendering of the light source. The light diffusing unit 1105 transmits light emitted by the light source 1102. The light diffusing unit 1105 can light up or the like to deliver the light of the light source over a broad range by effectively diffusing the light. The optical film 1104 and the light diffusing unit 1105 can be arranged on the light exiting side of the illumination. A cover can be arranged on the outermost portion of the illumination apparatus as needed.

The illumination apparatus 1100 is, for example, an apparatus for illuminating a room. The illumination apparatus 1100 can emit white light, natural white light, or light of any color from blue to red. The illumination apparatus 1100 can also include a light control circuit for adjusting these light components. The illumination apparatus 1100 can also include the light emitting apparatus of the present invention and a power supply circuit to be connected to the light emitting apparatus. The power supply circuit can be a circuit for converting an AC voltage into a DC voltage. In addition, "white" has a color temperature of about 4,200 K, and "natural white" has a color temperature of about 5,000 K. The illumination apparatus 1100 may also have a color filter.

Furthermore, the illumination apparatus according to the embodiments can have a heat radiation unit. The heat radiation unit radiates the internal heat of the apparatus to the outside of the apparatus, and a metal having a high specific heat and liquid silicon can be raised as examples of the heat radiation unit.

Figure 11B:
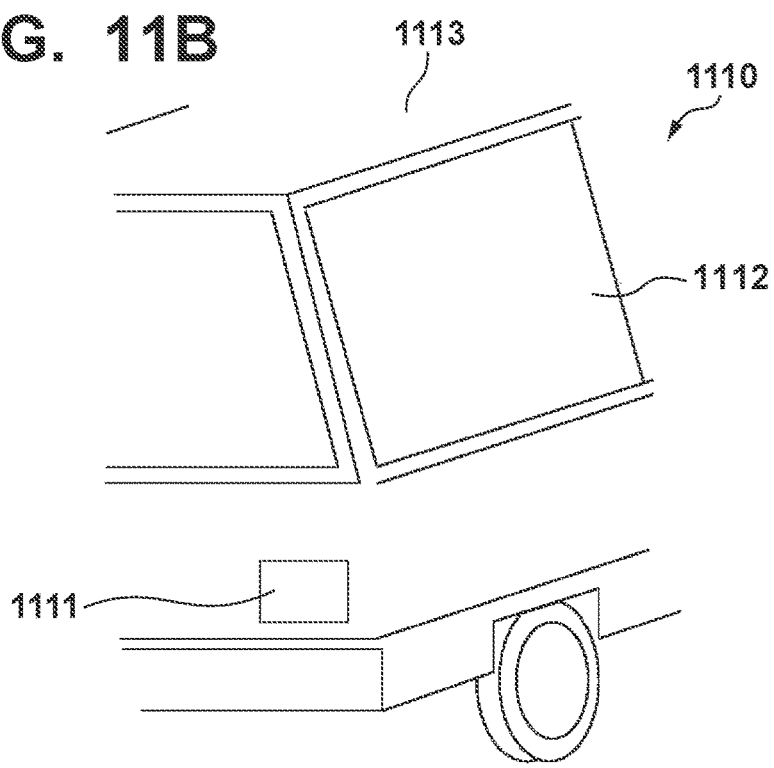

FIG. 11B is a schematic view of an automobile as an example of a moving body according to the embodiments. The automobile includes a taillight as an example of a lighting device. An automobile 1110 has a taillight 1111, and the taillight can be configured to turn on when a braking operation or the like is performed.

The taillight 1111 can include the light emitting apparatus according to the embodiments. The taillight can include a protection member for protecting an organic electroluminescent element. The material of the protection member is not limited as long as it is a transparent material which has some high degree of strength, and the material may be polycarbonate or the like. The protection member can also be formed by mixing a furandicarboxylic acid derivative or an acrylonitrile derivative with polycarbonate.

The automobile 1110 can include a vehicle body 1113 and a window 1112 attached to the vehicle body 1112. This window 1112 can be a transparent display unless it is a window to be used for checking the front and rear of the automobile 1110. The transparent display can include the light emitting apparatus according to the embodiments. In such a case, components such as electrodes and the like included in the light emitting apparatus will be made of transparent members.

The moving body according to the embodiments can be a ship, an airplane, a drone, or the like. The moving body can include a body and a lighting device installed in the body. The lighting device may emit light to perform notification of the current position of the body. The lighting device includes the light emitting apparatus according to the embodiments.

Application examples of the display apparatus according to the embodiments described above will be described with reference to FIGS. 12A and 12B. The display apparatus is applicable to, for example, a system that can be worn as a wearable device such as smart glasses, an HMD, smart contact lenses, or the like. An image capturing display apparatus that is used in such an application example includes an image capturing apparatus that can photoelectrically convert visible light and a display apparatus that can emit visible light.

Figure 12A:
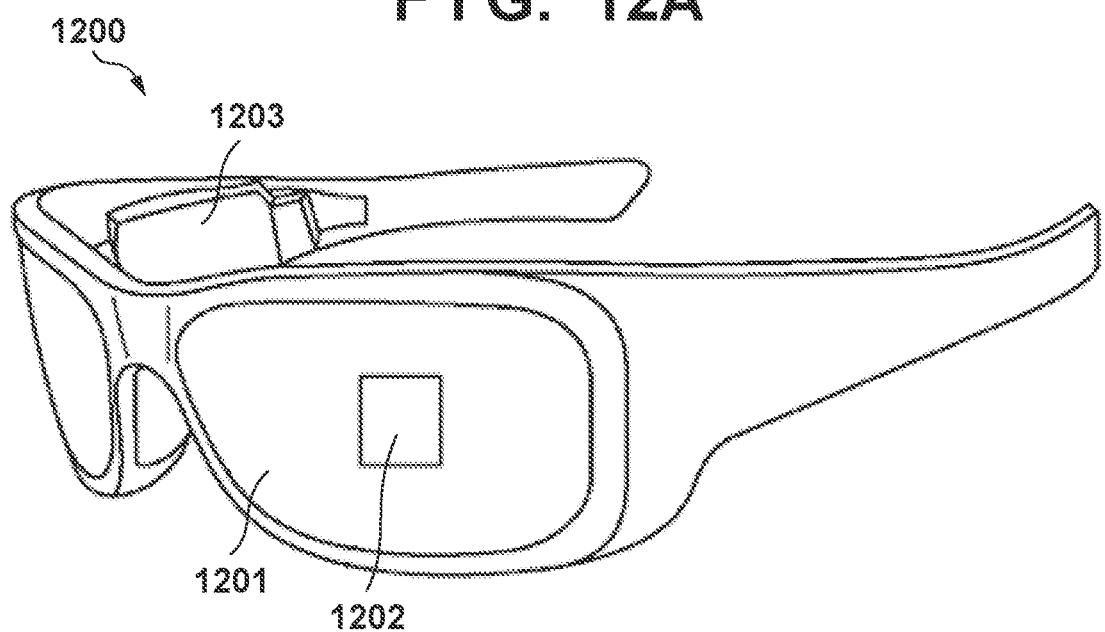
FIGS. 12A and 12B are views for explaining examples of the arrangement of glasses according to some of the embodiments of the present invention.

FIG. 12A illustrates a pair of glasses 1200 (smart glasses) according to an application example. An image capturing apparatus 1202 such as a CMOS sensor or an SPAD is arranged on the front surface side of a lens 1201 of the glasses 1200. Also, the display apparatus according to the embodiments described above is arranged on the back surface side of the lens 1201.

The pair of glasses 1200 further includes a control apparatus 1203. The control apparatus 1203 functions as a power supply that supplies power to the image capturing apparatus 1202 and the display apparatus according to the embodiments. The control apparatus 1203 functions as a control unit that controls the operation of the image capturing apparatus 1202 and the operation of the display apparatus.

An optical system for focusing light to the image capturing apparatus 1202 is formed on the lens 1201.

Figure 12B:
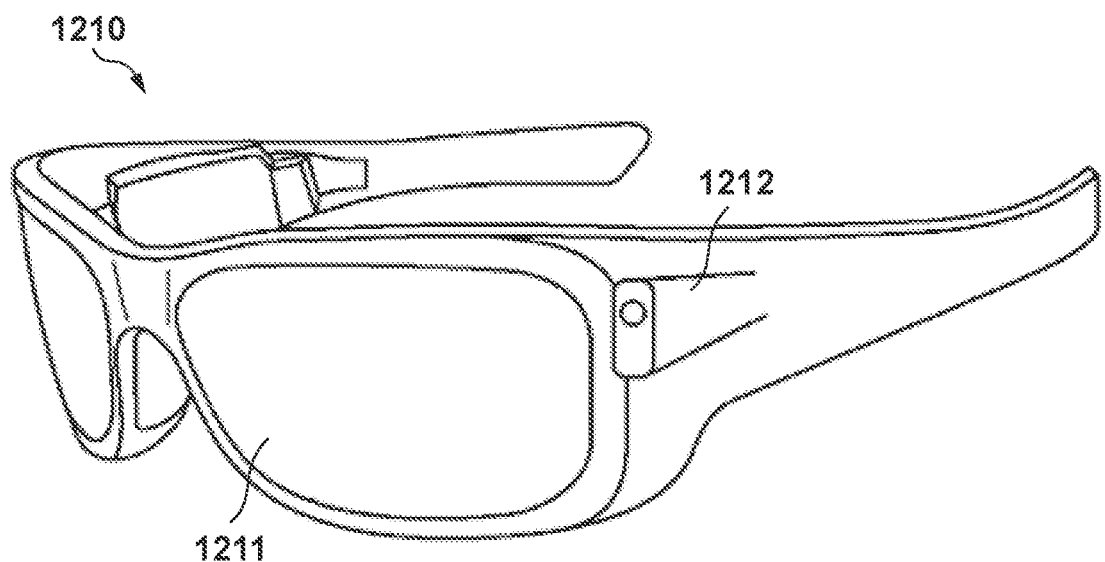

FIG. 12B illustrates a pair of glasses 1210 (smart glasses) according to another application example. The pair of glasses 1210 includes a control apparatus 1212, and an image capturing apparatus corresponding to the image capturing apparatus 1202 and a display apparatus are incorporated in the control apparatus 1212. An optical system for projecting light emitted from the image capturing apparatus and the display apparatus is formed in the control apparatus 1212, and an image is projected onto the lens 1211. In addition to functioning as a power supply that supplies power to the image capturing apparatus and the display apparatus, the control apparatus 1212 also controls the operation of the image capturing apparatus and the operation of the display apparatus. The control apparatus can also include a line-of-sight detection unit. Infrared light can be used for the line-of-sight detection. An infrared light emitting unit emits infrared light to the eyeball of a user who is gazing at displayed image. The reflected light from the eyeball that is obtained when the infrared light is emitted is detected by an image capturing unit which includes a light receiving element, thereby obtaining a captured image of the eyeball. Image quality degradation is reduced by providing a reduction unit that reduces the light from the infrared light emitting unit to the display unit in a planar view.

The line of sight of the user to the displayed image is detected from the captured image of the eyeball obtained by the image capturing operation using the infrared light. A known method can be arbitrarily applied for the line-of-sight detection using the captured eyeball image. As an example, a line-of-sight detection method based on Purkinje images caused by the reflection of the emitted light on the cornea can be used.

More specifically, line-of-sight detection processing is performed based on a pupil-cornea reflection method. The line of sight of the user is detected by using the pupil-cornea reflection method to calculate a line-of-sight vector representing the direction (rotation angle) of the eyeball based on the image of the pupil and the Purkinje images included in the captured image of the eyeball.

A display apparatus according to one embodiment of the present invention can include an image capturing apparatus including a light receiving element, and control a displayed image on the display apparatus based on the line-of-sight information of the user obtained from the image capturing apparatus.

More specifically, in the display apparatus, a first field-of-view region which is gazed by the user and a second field-of-view region other than the first field-of-view region are determined based on the line-of-sight information. The first field-of-view region and the second field-of-view region may be determined by a control apparatus of the display apparatus. Alternatively, the first field-of-view region and the second field-of-view region may be determined by an external control apparatus and the display apparatus may receive information corresponding to this determination. Control can be performed in the display region of the display apparatus so that the display resolution of the first field-of-view region will be higher than the display resolution of the second field-of-view region. That is, the resolution of the second field-of-view region may be lowered more than the resolution of the first field-of-view region.

In addition, the display region includes a first region and a second region different from the first region, and a region with a high degree of priority is determined from the first display region and the second display region of the display region based on the line-of-sight information. The first display region and the second display region may be determined by the control apparatus of the display apparatus. Alternatively, the first display region and the second display region may be determined by an external control apparatus and the display apparatus may receive information corresponding to this determination. Control may be performed so that the resolution of a region with the high degree of priority will be set higher than the resolution of a region other than the region with the high degree of priority. That is, the resolution of a region with a relatively low degree of priority can be set low.

Note that an AI can be used for the determination of the first field-of-view region and the region with the high degree of priority. The AI may be a model configured to estimate, from an image of the eyeball, the angle of the line of sight and the distance to an object as the target of the gaze by using the image of the eyeball and the direction actually gazed by the eyeball of the image as the teaching data. The display apparatus, the image capturing apparatus, or an external apparatus may include the AI program. If the AI program is included in an external apparatus, information determined by the AI program will be transmitted to the display apparatus by communication.

In a case in which display control is to be performed based on visual recognition detection, the display apparatus according to the embodiments can be applied to a pair of smart glasses that further includes an image capturing apparatus configured to capture the outside. The smart glasses can display the captured external information in real time. As described above, display with good image quality can be performed stably for a long period by using an apparatus that uses an organic light emitting element according to the embodiments.

The present invention is not limited to the above embodiments and various changes and modifications can be made within the spirit and scope of the present invention. Therefore, to apprise the public of the scope of the present invention, the following claims are made.

According to the above-described embodiments, the viewing angle characteristics are improved in a light emitting apparatus that has an interference structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-058309, filed Mar. 27, 2020 which is hereby incorporated by reference herein in its entirety.

What is claimed is:

1. A light emitting apparatus comprising:
   a first light emitting element for at least a first color, a second light emitting element for a second color whose wavelength is shorter than the first color, and a third light emitting element for a third color whose wavelength is shorter than the second color,
   wherein the first light emitting element includes a first reflective electrode layer, a transparent inorganic insulating layer, a transparent conductive layer, a first light emitting layer, and an upper electrode layer in this order,
   the second light emitting element includes a second reflective electrode layer, the transparent conductive layer, a second light emitting layer, and the upper electrode layer in this order, and the third light emitting layer includes a third reflective electrode layer, a third light emitting layer, and the upper electrode in this order, wherein optical distances L1, L2, and L3 formed between the upper electrode layer and the first reflective electrode layer, the second reflective electrode layer, and the third reflective electrode layer satisfy, $$L1 = (2m\pi - \Phi1) \times (\lambda1/4\pi) \pm \lambda1/8 \quad (1)$$

$$L2 = (2m\pi - \Phi2) \times (\lambda2/4\pi) \pm \lambda2/8 \quad (2)$$

$$L3 = (2m\pi - \Phi3) \times (\lambda3/4\pi) \pm \lambda3/8 \quad (3)$$

respectively, where $\lambda1$, $\lambda2$, and $\lambda3$ are dominant wavelengths of light beams emitted from the first reflective electrode layer, the second reflective electrode layer, and the third reflective electrode layer, respectively, m is one of 0 and 1, each of $\Phi1$, $\Phi2$, and $\Phi3$ is a sum of reflection phases, of the corresponding one of the dominant wavelengths $\lambda1$, $\lambda2$, and $\lambda3$ of the respective light emitting elements, on an interface of the reflective electrode layer and an interface of the upper electrode layer of the corresponding light emitting element, and wherein a refractive index of the transparent inorganic insulating layer is lower than a refractive index of a layer in contact with an upper face of the second reflective electrode layer.

2. The apparatus according to claim 1, wherein a color filter is arranged on the first light emitting element, the second light emitting element, and the third light emitting element.

3. The apparatus according to claim 1, wherein the first reflective electrode layer and the transparent conductive layer are electrically connected to each other.

4. The apparatus according to claim 1, wherein the second reflective electrode layer and the transparent conductive layer are in contact with each other.

5. The apparatus according to claim 1, wherein the first light emitting layer emits white light.

6. The apparatus according to claim 1, wherein the first light emitting layer emits light of the first color.

7. The apparatus according to claim 1, wherein a microlens is arranged on each of the first light emitting element, the second light emitting element, and the third light emitting element.

8. A display apparatus comprising:
a plurality of pixels,
wherein at least one of the plurality of pixels includes a light emitting apparatus according to claim 1 and a control unit configured to control light emission of the light emitting apparatus.

9. An image capturing apparatus comprising:
an optical unit that includes a plurality of lenses;
an image capturing element configured to receive light passed through the optical unit; and
a display unit configured to display an image captured by the image capturing element,
wherein the display unit includes a light emitting apparatus according to claim 1.

10. An electronic device comprising:
a display unit that includes a light emitting apparatus according to claim 1;
a housing including the display unit; and
a communication unit configured to communicate with the outside and arranged in the housing.

11. An illumination apparatus comprising:
a light source that includes a light emitting apparatus according to claim 1; and
one of a light diffusion unit and an optical film configured to transmit light emitted by the light source.

12. A moving body comprising:
a lighting device that includes a light emitting apparatus according to claim 1; and
a body configured to include the lighting device.

* * * * *